US012784796B2

(12) United States Patent
Takeda et al.

(10) Patent No.: US 12,784,796 B2
(45) Date of Patent: Nov. 3, 2026

(54) SEMICONDUCTOR DEVICE

(71) Applicant: Renesas Electronics Corporation, Tokyo (JP)

(72) Inventors: Koichi Takeda, Tokyo (JP); Takahiro Shimoi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 141 days.

(21) Appl. No.: 18/967,953

(22) Filed: Dec. 4, 2024

(65) Prior Publication Data

US 2025/0259663 A1 Aug. 14, 2025

(30) Foreign Application Priority Data

Feb. 9, 2024 (JP) ................................ 2024-018536

(51) Int. Cl.
*G11C 11/16* (2006.01)
*G11C 5/14* (2006.01)

(52) U.S. Cl.
CPC .......... *G11C 11/1673* (2013.01); *G11C 5/147* (2013.01); *G11C 11/1659* (2013.01)

(58) Field of Classification Search
CPC ............................ G11C 5/147; G11C 11/1673
USPC .......................................................... 365/158
See application file for complete search history.

(56) References Cited

U.S. PATENT DOCUMENTS

2015/0262701 A1* 9/2015 Takizawa ............ G11C 11/1675 365/96
2016/0071567 A1* 3/2016 Fujita .................. G11C 13/004 365/158
2016/0379699 A1* 12/2016 Takahashi ........... G11C 11/1673 365/158

OTHER PUBLICATIONS

Yi-Chun Shih et al. "A Reflow-capable, Embedded 8Mb STT-MRAM Macro with 9nS Read Access Time in 16nm FinFET Logic CMOS Process", TSMC, 2020 IEEE International Electron Devices Meeting (IEDM).

* cited by examiner

*Primary Examiner* — Anthan Tran
(74) *Attorney, Agent, or Firm* — Rimon P.C.

(57) ABSTRACT

A semiconductor device includes a variable-resistance memory cell array, a sense amplifier electrically connected to the variable-resistance memory cell array, and a clamp voltage generation circuit electrically connected to the sense amplifier. The sense amplifier includes an amplification unit that amplifies a voltage at a sense node, a first clamp circuit having first and second NMOS transistors whose gate terminals are electrically connected, a second clamp circuit having third and fourth NMOS transistors whose gate terminals are electrically connected, a fifth NMOS transistor electrically connected to the variable-resistance memory cell array, a reference resistor, and a sixth NMOS transistor electrically connected to the reference resistor. The first and third NMOS transistors are connected in series between the sense node and the fifth NMOS transistor, and the second and fourth NMOS transistors are connected in series between the sense node and the sixth NMOS transistor.

11 Claims, 15 Drawing Sheets

$$Icell = Gm \times (Vclamp - Vbl - Vthn)^2 \times (1 + \lambda Vds) \cdots (1)$$
$$Ip = Gm \times (Vclamp - Vbl(p) - Vthn) \cdots (2)$$
$$Iap = Gm \times (Vclamp - Vbl(ap) - Vthn) \cdots (3)$$
$$Vbl(p) = Rp \times Ip \cdots (4)$$
$$Vbl(ap) = Rap \times Iap \cdots (5)$$
WHEN SUBSTITUTING (4) AND (5) INTO (2) AND (3),
$$Ip = (Vclamp - Vthn) / (1/Gm + Rp) \cdots (6)$$
$$Iap = (Vclamp - Vthn) / (1/Gm + Rap) \cdots (7)$$

SEMICONDUCTOR DEVICE

CROSS-REFERENCE TO RELATED APPLICATIONS

The disclosure of Japanese Patent Application No. 2024-018536 filed on Feb. 9, 2024 including the specification, drawings and abstract is incorporated herein by reference in its entirety.

BACKGROUND

The present invention relates to a semiconductor device, and for example, relates to a semiconductor device including a storage device having a variable-resistance memory cell.

There are disclosed techniques listed below.

[Non-Patent Document 1] "A Reflow-capable, Embedded 8 Mb STT-MRAM Macro with 9 nS Read Access Time in 16 nm FinFET Logic CMOS Process", TSMC, IEDM 2020

The variable-resistance memory cell indicates a storage element of which resistance value changes according to stored information, and examples of the storage device including such a variable-resistance memory cell (hereinafter, also simply referred to as a memory cell) include a magnetoresistive memory (magnetoresistive random access memory, hereinafter, also referred to as an MRAM). A technique related to the MRAM is disclosed in, for example, Non-Patent Document 1.

SUMMARY

The present inventors have studied the technique related to the MRAM described in Non-Patent Document 1. Studies by the present inventors will be described later in a comparative example, and thus will be omitted here. However, it has been found that there is a problem that it is difficult to achieve both a high-speed operation and a stable operation at a high temperature in the technique disclosed in Non-Patent Document 1.

An outline of a representative embodiment among embodiments disclosed in the present application will be briefly described as follows. In the following description, a field effect transistor is also referred to as a MOS transistor, an N-channel MOS transistor is also referred to as an NMOS transistor, and a P-channel MOS transistor is also referred to as a PMOS transistor.

A semiconductor device according to one embodiment includes a variable-resistance memory cell array, a sense amplifier electrically connected to the variable-resistance memory cell array, and a clamp voltage generation circuit electrically connected to the sense amplifier.

In the semiconductor device, the sense amplifier includes an amplification unit configured to amplify a voltage at a sense node, a first clamp circuit having a first NMOS transistor and a second NMOS transistor, gate terminals of which are electrically connected to each other, a second clamp circuit having a third NMOS transistor and a fourth NMOS transistor, gate terminals of which are electrically connected to each other, a fifth NMOS transistor electrically connected to the variable-resistance memory cell array, a reference resistor, and a sixth NMOS transistor electrically connected to the reference resistor.

Here, a drain terminal of the third NMOS transistor is electrically connected to the amplification unit via a first node configuring the sense node, a drain terminal of the fourth NMOS transistor is electrically connected to the amplification unit via a second node configuring the sense node, a source terminal of the third NMOS transistor is electrically connected to a drain terminal of the first NMOS transistor via a third node, a source terminal of the fourth NMOS transistor is electrically connected to a drain terminal of the second NMOS transistor via a fourth node, a source terminal of the first NMOS transistor is electrically connected to a drain terminal of the fifth NMOS transistor via a fifth node, a source terminal of the second NMOS transistor is electrically connected to a drain terminal of the sixth NMOS transistor via a sixth node, a source terminal of the fifth NMOS transistor is electrically connected to the variable-resistance memory cell array, a source terminal of the sixth NMOS transistor is electrically connected to the reference resistor, the clamp voltage generation circuit supplies a first clamp voltage to the gate terminals of the first NMOS transistor and the second NMOS transistor and supplies a second clamp voltage to the gate terminals of the third NMOS transistor and the fourth NMOS transistor, and transconductance of the third NMOS transistor and the fourth NMOS transistor is lower than transconductance of the first NMOS transistor and the second NMOS transistor.

Other problems and novel features will become apparent from the description of the present specification and the accompanying drawings.

According to one embodiment, it is possible to provide a semiconductor device including a storage device capable of achieving both a high-speed operation and a stable operation.

DETAILED DESCRIPTION

Hereinafter, embodiments of the present invention will be described with reference to the drawings. Note that the disclosure is merely an example, and appropriate modifications that can be easily conceived by those skilled in the art while maintaining the gist of the invention are naturally included in the scope of the present invention.

Furthermore, in the present specification and each drawing, elements similar to those described before with respect to the previously described drawings are denoted by the same reference signs, and detailed description thereof may be appropriately omitted.

Comparative Example

Hereinafter, a plurality of embodiments will be described. In order to facilitate understanding of the embodiments, the technique disclosed in Non-Patent Document 1, and the problem found by the present inventors will be described using a comparative example before describing the embodiments.

<<Configuration and Operation of Comparative Example>>

Figure 15A:
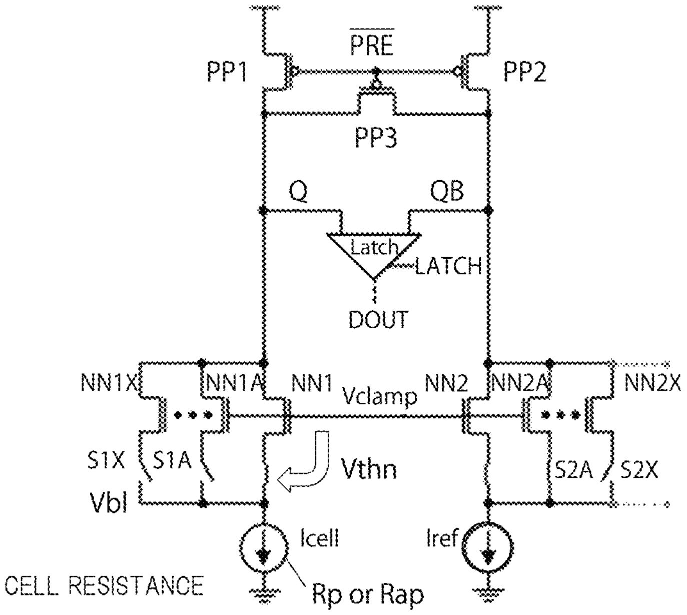
FIGS. 15A and 15B are diagrams for describing a comparative example studied by the present inventors.
Figure 15B:
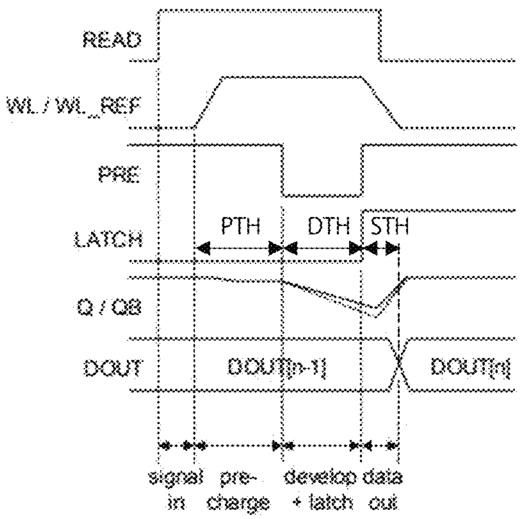

FIGS. 15A and 15B are diagrams for describing a comparative example studied by the present inventors. FIGS. 15A and 15B are similar to FIG. 6 of Non-Patent Document 1. The main difference is that, in FIGS. 15A and 15B, the present inventors additionally add a reference sign (for example, Vthn or the like) to FIG. 6 of Non-Patent Document 1, in order to facilitate the description. In FIGS. 15A and 15B, FIG. 15A illustrates a circuit diagram of the comparative example, and FIG. 15B is a waveform diagram illustrating an operation of FIG. 15A.

Here, the circuit diagram of FIG. 15A illustrates a portion related to a sense amplifier used when reading information stored in a memory cell.

The sense amplifier includes a latch unit Latch that is connected to a pair of sense nodes Q and QB, amplifies a minute potential difference between the sense nodes Q and QB when activated by an activation signal LATCH, and outputs the amplified potential difference as an output DOUT, and a precharge circuit configured by PMOS transistors PP1 to PP3.

The potentials of the pair of sense nodes Q and QB are determined by a memory cell and a reference resistor. In FIG. 15A, the memory cell is equivalently represented by a current source Icell, and the reference resistor is equivalently represented by a current source Iref. A resistance value (cell resistance) of the memory cell is in a state of a low resistance Rp or a high resistance Rap (low resistance Rp<high resistance Rap) according to stored information. Therefore, a value of the current source Icell equivalently representing the memory cell changes according to the stored information. A value of the current source Iref equivalently representing the reference resistor is a value (for example, an intermediate value) between the value of the current source Icell corresponding to the high resistance and the value of the current source Icell corresponding to the low resistance.

Clamp elements are connected between the pair of sense nodes Q and QB and the memory cell (current source Icell) and the reference resistor (current source Iref). The clamp elements are configured by NMOS transistors NN1 and NN2, gate terminals of which are supplied with a clamp voltage Vclamp. In FIG. 15A, Vthn indicates a threshold voltage of the NMOS transistors NN1 and NN2, and Vbl indicates a voltage applied to the memory cell and the reference resistor. A value of the voltage Vbl of the memory cell varies depending on the value of the cell resistance, but can be limited (clamped) to, for example, about 0.1 V by appropriately setting the clamp voltage Vclamp and the threshold voltage Vthn.

As a result, the voltage Vbl applied to the memory cell and the reference resistor is clamped to about 0.1 V even in a precharge period indicated by a reference sign PTH in FIG. 15B (a period in which the PMOS transistors PP1 to PP3 are in an on state). Thereafter, a potential difference determined by the memory cell and the reference resistor is generated between the sense nodes Q and QB in a discharge period indicated by a reference sign DTH (a period in which the PMOS transistors PP1 to PP3 are in an off state), and the potential difference between the sense nodes Q and QB is amplified by the latch unit Latch in a sense period indicated by a reference sign STH.

In FIG. 15A, NMOS transistors NN1A to NN1X and NN2A to NN2X, and switches S1A to S1X and S2A to S2X are for correcting a variation. That is, when a relative variation occurs between the clamp element (NMOS transistor NN1) corresponding to the memory cell and the clamp element (NMOS transistor NN2) corresponding to the reference resistor and/or when an offset occurs between inputs of the latch unit Latch due to the variation of the latch unit Latch, for example, one (S2A) of the switches S1A to S1X and S2A to S2X is turned on. As a result, for example, the NMOS transistor NN2A is connected in parallel to the clamp element (NMOS transistor NN2) corresponding to the reference resistor, and the variation can be reduced.

When it is not necessary to correct a variation, the clamp element can be configured by the two NMOS transistors NN1 and NN2, and even when a plurality of sense amplifiers are provided in the storage device, it is possible to suppress an increase in an occupied area occupied by the clamp element. Furthermore, since the clamp voltage Vclamp can be common to the clamp elements provided in the plurality of sense amplifiers, the increase in the occupied area can also be suppressed in this respect.

<<Studies by Present Inventors>>

In general, in a memory cell configuring an MRAM, a resistance ratio of a resistance value corresponding to stored information deteriorates as an ambient temperature rises. That is, the cell resistance becomes the high resistance Rap or the low resistance Rp according to the stored information, but a TMR ratio, which is a resistance ratio between the high resistance Rap and the low resistance Rp, deteriorates as the ambient temperature rises. The value of the current source Iref based on the reference resistor is set between the value of the current source Icell corresponding to the high resistance Rap and the value of the current source Icell corresponding to the low resistance Rp. However, since the resistance ratio deteriorates as the temperature rises, a current difference between the current source Iref and the current source Icell decreases, and a read margin at a high temperature decreases.

In the configuration of the comparative example illustrated in FIGS. 15A and 15B, it is possible to improve the read margin at the high temperature by the following two means.

<<<First Means>>>

The first means is to improve transconductance (Gm) of the NMOS transistors NN1 and NN2 configuring the clamp element. For example, by improving (increasing) the transconductance of the NMOS transistor NN1, a conversion efficiency at the time of conversion from the cell resistance to a cell current (corresponding to the current source Icell) can be improved. Therefore, even when the TMR ratio deteriorates due to the high temperature, it is possible to secure a sufficient read margin.

The first means will be described in detail using the mathematical expression illustrated in FIG. 16 as follows. In Expression (1) of FIG. 16, a reference sign A indicates a channel length modulation coefficient of the NMOS transistors NN1 to NN1X, and a reference sign Vds indicates a drain-source voltage of the NMOS transistors NN1 to NN1X.

For ease of description, assuming that the channel length modulation coefficient λ is 0 and a multiplier 2 is 1, a current Ip (current source Icell) of the memory cell when the cell resistance is the low resistance Rp is represented by Expression (2), and a current Iap (current source Icell) of the memory cell when the cell resistance is the high resistance Rap is represented by Expression (3). In Expressions (2) and (3), the reference signs Vbl(p) and Vbl(ap) represent a voltage of the memory cell generated when the cell resistance is the low resistance Rp and a voltage of the memory cell generated when the cell resistance is the high resistance Rap, as indicated in Expressions (4) and (5). Expressions (6) and (7) are obtained by substituting Expressions (4) and (5) into Expressions (2) and (3).

As understood from Expressions (6) and (7), as the transconductance Gm increases, the ratio of the value of the cell resistance to the currents Ip and Iap of the memory cell increases. That is, when the value of the cell resistance changes from the low resistance Rp to the high resistance Rap (or from Rap to Rp), an amount of change in the cell current flowing through the memory cell can be increased, and the read margin can be secured.

<<<Second Means>>>

As described with reference to FIG. 15A, the second means is to correct the variation by the NMOS transistors NN1A to NN1X and NN2A to NN2X, and the switches S1A to S1X and S2A to S2X. By the correction, for example, it is possible to improve the read margin by reducing the offset between the inputs of the latch unit Latch.

<<<Problems Caused by First Means and Second Means>>>

The transconductance Gm is determined by a ratio (W/L) of a channel width W to a channel length L of the NMOS transistor. The first means is realized by, for example, increasing the channel width W of the NMOS transistor NN1 to improve the transconductance Gm. In this case, overlap between drain diffusion regions and gate terminals of the NMOS transistors NN1 and NN2 connected to the sense nodes Q and QB increases, and a drain capacitance (a capacitance formed by the overlap between the drain diffusion regions and the gate terminals) of the NMOS transistors NN1 and NN2 connected to the sense nodes Q and QB increases.

In the case of adopting the second means, the drain diffusion regions of the correction NMOS transistors NN1A to NN1X and NN2A to NN2X are connected to the drain diffusion regions of the NMOS transistors NN1 and NN2 by, for example, a wiring. That is, the wiring connecting the correction NMOS transistors and the drain diffusion regions of the correction NMOS transistors are connected to the sense nodes Q and QB. Therefore, even when the second means is adopted, a parasitic capacitance (a wiring capacitance, a drain capacitance of the correction NMOS transistors, and the like) connected to the sense nodes Q and QB increases.

When the parasitic capacitance (including the drain capacitance) connected to the sense nodes Q and QB increases, it takes time for the potentials of the sense nodes Q and QB to decrease according to the memory cell and the reference resistor. Referring to FIG. 15B, the discharge period DTH illustrated in FIG. 15B becomes long, and it becomes difficult to achieve a high-speed operation of a read operation.

That is, it has been found that, in a case where a stable operation of an MRAM is achieved by securing or improving a read margin at a high temperature, it is difficult to achieve the high-speed operation, and a problem arises in which it is difficult to achieve both the stable operation at the high temperature and the high-speed operation.

First Embodiment

<Configuration of Semiconductor Device>

Figure 14:
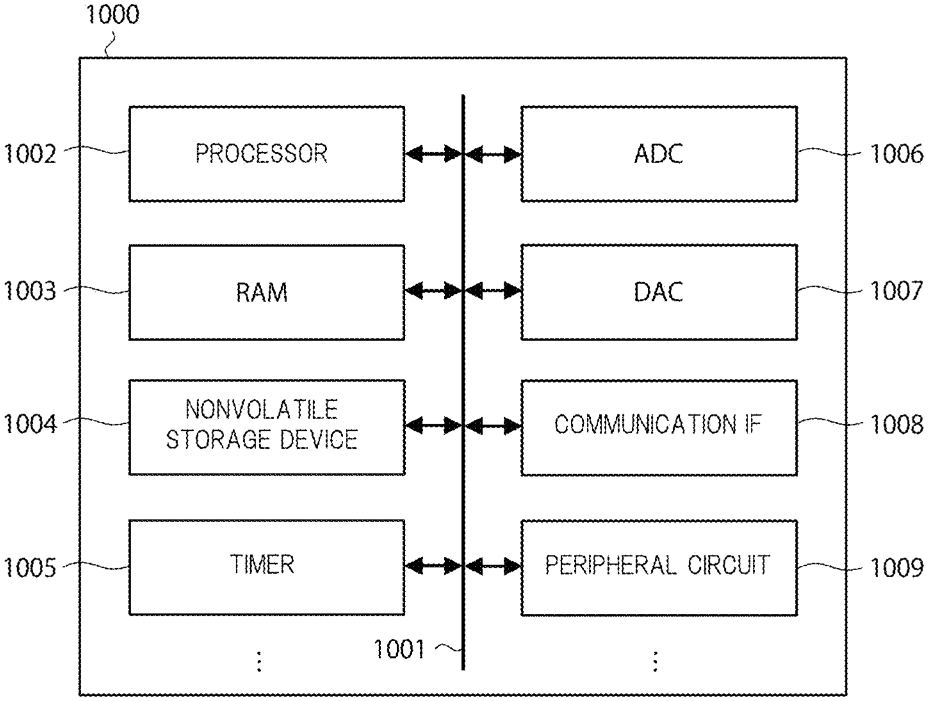
FIG. 14 is a block diagram illustrating a configuration of the semiconductor device according to the first embodiment.

FIG. 14 is a block diagram illustrating a configuration of a semiconductor device according to a first embodiment. In FIG. 14, a reference numeral 1000 indicates a semiconductor device. The semiconductor device 1000 includes an internal bus 1001 and a plurality of circuit blocks connected to the internal bus 1001. In FIG. 14, as examples of the plurality of circuit blocks, a processor 1002, a volatile storage device (RAM) 1003, a nonvolatile storage device 1004, a timer 1005, an analog/digital conversion circuit (ADC) 1006, a digital/analog conversion circuit (DAC) 1007, a communication interface circuit (communication IF) 1008, and a peripheral circuit 1009 are indicated. Note that the circuit blocks illustrated in FIG. 14 are examples, and it is not limited thereto.

For example, when the processor 1002 operates according to a program, a predetermined function is realized by the semiconductor device 1000. In order to realize the predetermined function, the circuit blocks (for example, the nonvolatile storage device 1004, the peripheral circuit 1009, and the like) connected to the internal bus 1001 are accessed by the processor 1002 through the internal bus 1001 when the processor 1002 operates.

<<Configuration of Nonvolatile Storage Device>>

Figure 13:
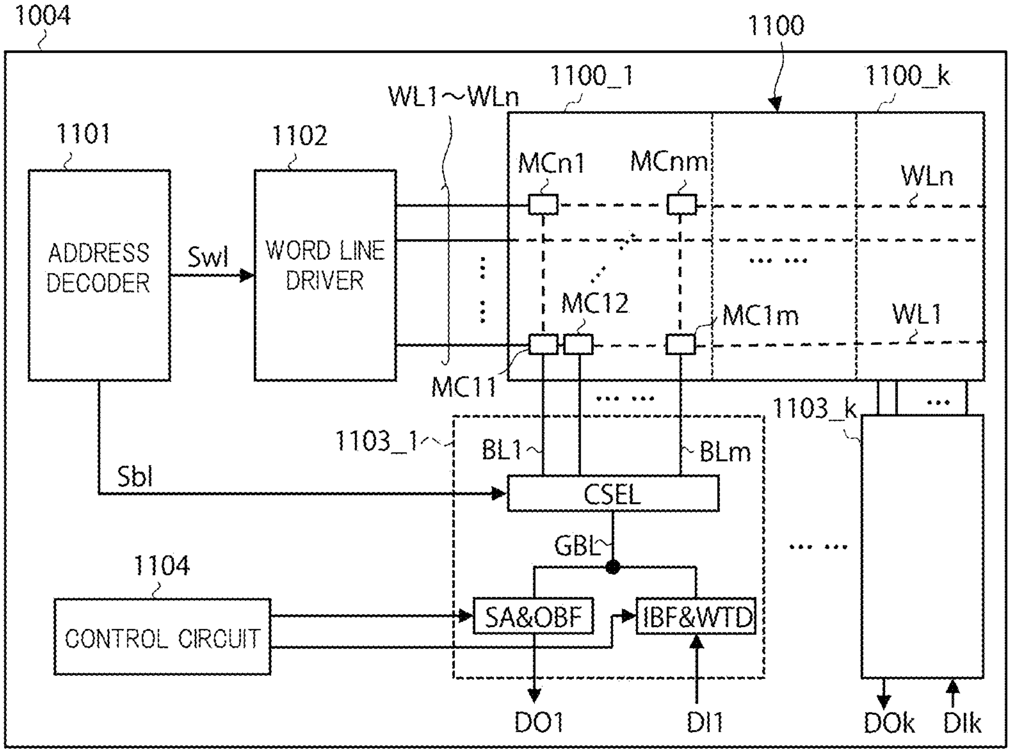
FIG. 13 is a block diagram illustrating a configuration of a nonvolatile storage device incorporated in a semiconductor device according to the first embodiment.

FIG. 13 is a block diagram illustrating a configuration of a nonvolatile storage device (hereinafter, also simply referred to as a storage device) incorporated in the semiconductor device according to the first embodiment. The nonvolatile storage device 1004 according to the first embodiment is an MRAM. The nonvolatile storage device 1004 according to the first embodiment includes a memory cell array (variable-resistance memory cell array) 1100 in which a plurality of memory cells MC11 to MCnm and the like configuring the MRAM are arranged in an array, an address decoder 1101, a word line driver 1102, a plurality of input/output circuits 1103_1 to **1103_*k*, and a control circuit 1104**.

The memory cell array 1100 includes a unit memory cell arrays 1100_1 to **1100_*k* corresponding to the input/output circuits 1103_1 to 1103_*k*. Since the unit memory cell arrays 1100_1 to 1100_*k* have the same configuration as each other, in FIG. 13, only the unit memory cell array 1100_1 corresponding to the input/output circuit 1103_1 is clearly illustrated with the memory cells MC11 to MCnm arranged in an array, and the memory cells and the like are omitted for the other unit memory cell arrays. Also in the unit memory cell array 1100_1**, since a plurality of memory cells are arranged in an array, the unit memory cell array can also be regarded as a memory cell array.

In the memory cell array 1100, common word lines WL1 to WLn are arranged in respective rows, and memory cells arranged in the same row are connected. In addition, bit lines BL1 to BLm are arranged in respective columns of the unit memory cell array 1100_1, and the memory cells arranged in the same column are connected. Although not illustrated in FIG. 13, a write (high resistance state) source line SL is provided in the column to correspond to the bit lines BL1 to BLm.

A row address signal and a column address signal (not illustrated) are supplied from the internal bus 1001 illustrated in FIG. 14 to the address decoder 1101, the row address signal is decoded, and a decoding result Swl is supplied to the word line driver 1102. Furthermore, the address decoder 1101 decodes the column address signal and supplies a decoding result Sbl to the input/output circuits 1103_1 to 1103_*k*.

The word line driver 1102 supplies a select voltage (for example, a high level) to a word line indicated by the decoding result Swl, that is, a word line selected by the row address signal, and supplies a non-select voltage (for example, a low level) to the other word lines. As a result, a plurality of memory cells connected to the word line to which the select voltage is supplied is selected and electrically connected to the bit line.

The input/output circuit 1103_1 includes a column selector CSEL, a write system circuit IBF & WTD, and a read system circuit SA & OBF. The column selector CSEL is connected to the bit lines BL1 to BLm arranged in the corresponding unit memory cell array 1100_1, selects a bit line indicated by the decoding result Sbl, that is, a bit line selected by the column address signal, sets the selected bit line as a common bit line GBL, and is connected to the write system circuit IBF & WTD and the read system circuit SA & OBF.

The write system circuit IBF & WTD, the read system circuit SA & OBF, and the control circuit 1104 are connected to the internal bus 1001 illustrated in FIG. 14. When a write operation to the storage device 1004 is instructed from the processor 1002 via the internal bus 1001, for example, the control circuit 1104 operates the write system circuit IBF & WTD. As a result, information from the internal bus 1001 is supplied to the bit line selected by the column address signal via the write system circuit IBF & WTD and the common bit line GBL, and is written in the memory cell connected to this bit line.

Furthermore, in a case where a read operation to the storage device 1004 is instructed from the processor 1002, for example, via the internal bus 1001, the control circuit 1104 operates the read system circuit SA & OBF. The read system circuit SA & OBF in configured by a sense amplifier SA and an output buffer circuit OBF. Information on the common bit line GBL is amplified by the sense amplifier SA and output to the internal bus 1001 via the output buffer circuit OBF.

<<Sense Amplifier>>

Figure 1A:
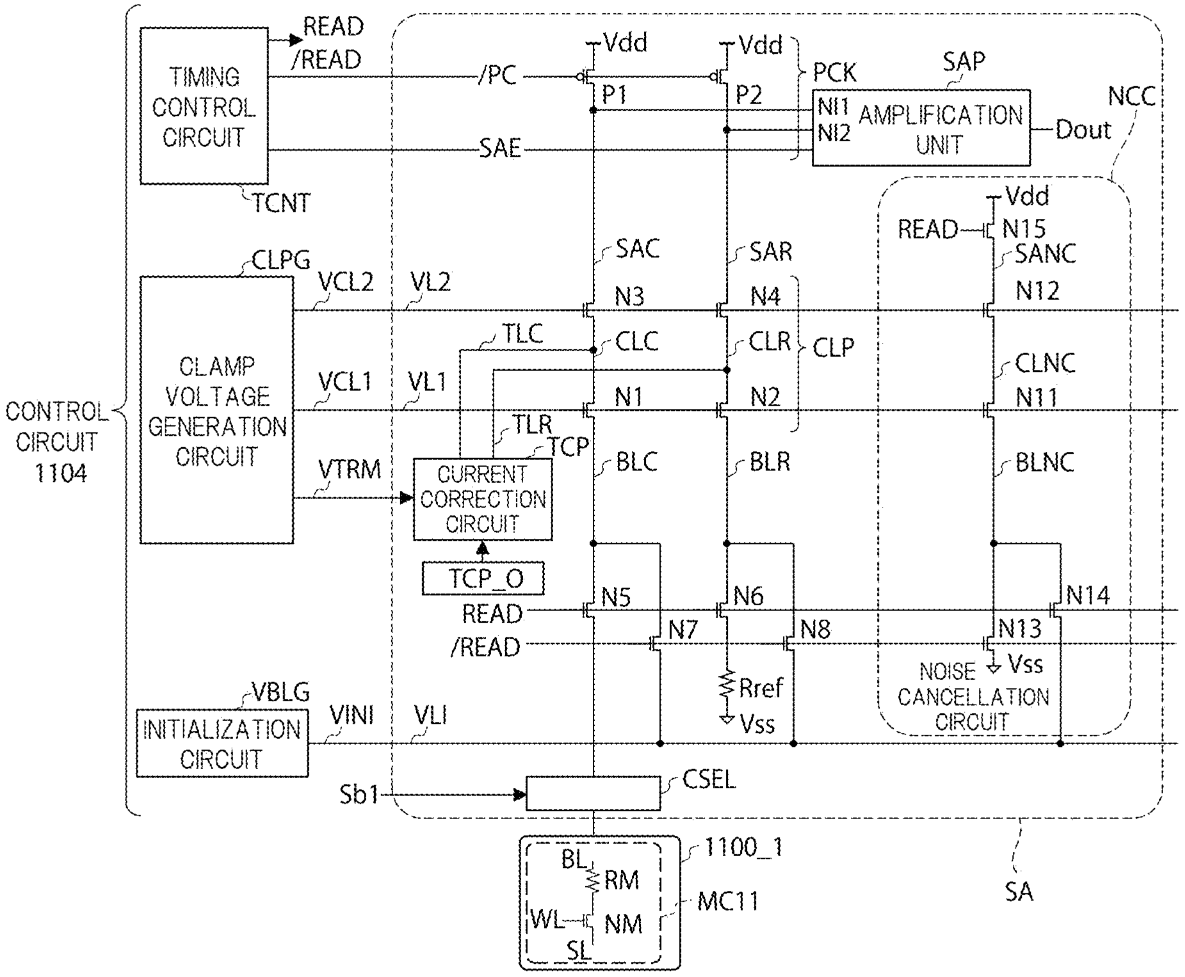
FIGS. 1A and 1B are diagrams for describing a sense amplifier according to a first embodiment.
Figure 1B:
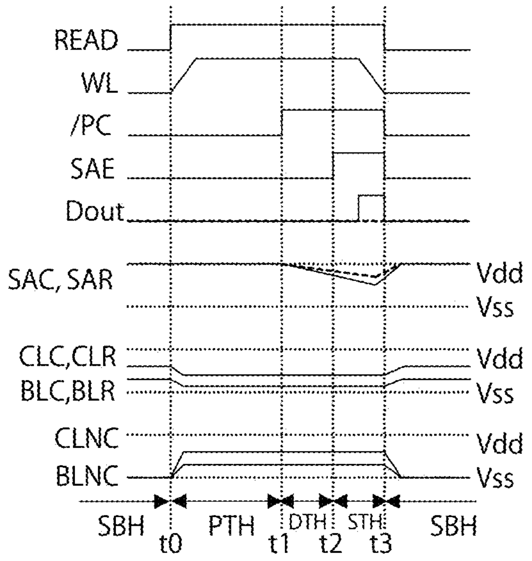

FIGS. 1A and 1B are diagrams for describing a sense amplifier according to the first embodiment. FIG. 1A is a circuit diagram illustrating a configuration of the sense amplifier, and FIG. 1B is a waveform diagram illustrating an operation of the sense amplifier.

FIG. 1A also illustrates a main part of the control circuit 1104 illustrated in FIG. 13 in addition to the sense amplifier SA. In addition, FIG. 1A illustrates an example in which the column selector CSEL is disposed in the sense amplifier SA, but it is not limited thereto. That is, as described in FIG. 13, the column selector CSEL may be disposed between the unit memory cell array 1100_1 and the sense amplifier SA. Further, as illustrated in FIG. 13, the plurality of memory cells MC11 to MCnm are arranged in an array in the unit memory cell array 1100_1, but in FIG. 1A, one memory cell MC11 among the plurality of memory cells is drawn as a representative.

<<<Configuration of Memory Cell>>>

As understood from the configuration of the memory cell MC11 illustrated in FIG. 1A as a representative, the memory cell is configured by an NMOS transistor NM connected in series between the bit line BL and a wiring SL to which a ground voltage Vss is supplied, and a resistance element (MRAM resistance element) RM. A resistance value of the resistance element RM becomes a high resistance or a low resistance according to stored information. A gate terminal of the NMOS transistor NM is connected to the word line WL, and when a high level indicating selection is supplied to the word line WL, the memory cell MC11 is selected, and a resistance element having a resistance value corresponding to the stored information is connected between the bit line BL and the wiring SL of the ground voltage Vss via the NMOS transistor NM.

<<<Configuration of Sense Amplifier>>>

The sense amplifier SA includes PMOS transistors P1 and P2, NMOS transistors N1 to N8, a noise cancellation circuit NCC, an amplification unit SAP, a reference resistor Rref, a current correction circuit TCP, a correction information storage circuit TCP_O, and a column selector CSEL. Further, the sense amplifier SA includes a cell-side sense line SAC, a reference-side sense line SAR, a cell-side bit line BLC, a reference-side bit line BLR, a first clamp voltage line VL1, a second clamp voltage line VL2, a correction current line TLC, a correction current line TLR, and an initial voltage line VLI.

A source terminal of the PMOS transistor P1 is connected to a power supply voltage Vdd, and a drain terminal thereof is connected to the cell-side sense line SAC. A source terminal of the PMOS transistor P2 is connected to the power supply voltage Vdd, and a drain terminal thereof is connected to the reference-side sense line SAR. A precharge signal/PC is supplied to the gate terminals of the PMOS transistors P1 and P2, and the PMOS transistors P1 and P2 configure a precharge circuit PCK. That is, while the precharge signal/PC is at a low level, the PMOS transistors P1 and P2 are turned on, and the cell-side sense line SAC and the reference-side sense line SAR are precharged at the power supply voltage Vdd.

The amplification unit SAP includes a pair of sense nodes NI1 and NI2, amplifies a potential difference between the pair of sense nodes NI1 and NI2 when an activation signal SAE becomes a high level, and outputs the amplified potential difference to an output buffer circuit OBF (not illustrated) as an output Dout. Among the pair of sense nodes of the amplification unit SAP, one sense node NI1 is connected to the cell-side sense line SAC, and the other sense node NI2 is connected to the reference-side sense line SAR.

Each of the NMOS transistors N1 to N4 functions as the clamp element, and the NMOS transistors N1 to N4 configure a clamp circuit CLP. That is, the clamp circuit CLP includes the NMOS transistor N3 having a drain terminal connected to the cell-side sense line SAC and a source terminal connected to a connection node CLC, and the NMOS transistor N4 having a drain terminal connected to the reference-side sense line SAR and a source terminal connected to the connection node CLR. Further, the clamp circuit CLP includes the NMOS transistor N1 having a drain terminal connected to the connection node CLC and a source terminal connected to the cell-side bit line BLC, and the NMOS transistor N2 having a drain terminal connected to the connection node CLR and a source terminal connected to the reference-side bit line.

In other words, the clamp circuit CLP can be regarded as including the NMOS transistors N3 and N1, source-drain paths of which are connected in series between the cell-side sense line SAC and the cell-side bit line BLC, and the NMOS transistors N4 and N2, source-drain paths of which are connected in series between the reference-side sense line SAR and the reference-side bit line BLR.

In the clamp circuit CLP, the gate terminal of the NMOS transistor N1 and the gate terminal of the NMOS transistor N2 are commonly connected to the first clamp voltage line VL1, and the gate terminal of the NMOS transistor N3 and the gate terminal of the NMOS transistor N4 are commonly connected to the second clamp voltage line VL2. Therefore, the clamp circuit CLP can also be regarded as being configured by the first clamp circuit including the NMOS transistors N1 and N2 and the second clamp circuit including the NMOS transistors N3 and N4.

In the first embodiment, transconductance Gm of the NMOS transistors N3 and N4 configuring the second clamp circuit is set to be smaller than transconductance Gm of the NMOS transistors N1 and N2 configuring the first clamp circuit. In order to set the transconductance Gm in this manner, for example, when the channel lengths L of the NMOS transistors N1 to N4 are the same, the channel width W of the NMOS transistors N1 and N2 is set to be longer (larger) than the channel width W of the NMOS transistors N3 and N4. When the channel widths W of the NMOS transistors N1 to N4 are the same, the channel length L of the NMOS transistors N1 and N2 is set to be shorter (smaller) than the channel length L of the NMOS transistors N3 and N4. When the ratio (W/L) between the channel width W and the channel length L of the NMOS transistor is a size of the NMOS transistor, sizes of the NMOS transistors N3 and N4 are set to be smaller than sizes of the NMOS transistors N1 and N2.

The NMOS transistors N5 to N8 configure changeover switches for initializing the cell-side bit line BLC and the reference-side bit line BLR. Drain terminals of the NMOS transistors N5 and N7 are connected to the cell-side bit line BLC, a source terminal of the NMOS transistor N5 is connected to the column selector CSEL, and a source terminal of the NMOS transistor N7 is connected to the initial voltage line VLI. Drain terminals of the NMOS transistors N6 and N8 are connected to the reference-side bit line BLR, a source terminal of the NMOS transistor N6 is connected to the ground voltage Vss via the reference resistor Rref, and a source terminal of the NMOS transistor N8 is connected to the initial voltage line VLI.

The gate terminal of the NMOS transistor N5 and the gate terminal of the NMOS transistor N6 are commonly connected, and a read signal READ is supplied. In addition, the gate terminal the NMOS transistor N7 and the gate terminal of the NMOS transistor N8 are commonly connected, and a read signal/READ is supplied. Since the read signal/READ is an inverted signal (inverted read signal) of the read signal READ, the NMOS transistors N5 and N7 are complementarily turned on (turned off), and the NMOS transistors N6 and N8 are also complementarily turned on (turned off).

In the correction information storage circuit TCP_O, for example, correction information for correcting an offset or the like at the input of the amplification unit SAP is stored in advance. The correction information stored in the correction information storage circuit TCP_O is supplied to the current correction circuit TCP. The current correction circuit TCP generates a correction current by using the supplied correction information and a bias signal (correction current bias signal) VTRM while the read signal READ is at a high level, and supplies the correction current to the connection nodes CLC and/or CLR via the correction current lines TLC and TLR.

<<<<Noise Cancellation Circuit>>>>

The noise cancellation circuit NCC includes NMOS transistors N11 to N15, a noise canceling-side (hereinafter, also referred to as NC-side) sense line SANC, and an NC-side bit line BLNC.

A drain terminal of the NMOS transistor N15 is connected to the power supply voltage Vdd, a source terminal thereof is connected to the NC-side sense line SANC, and a gate terminal is supplied with the read signal READ. A drain terminal of the NMOS transistor N12 is connected to the NC-side sense line SANC, a source terminal thereof is connected to a connection node CLNC, a drain terminal of the NMOS transistor N11 is connected to the connection node CLNC, and a source terminal thereof is connected to the NC-side bit line BLNC. A gate terminal of the NMOS transistor N11, source-drain paths of which are connected in series is connected to the first clamp voltage line VL1, and a gate terminal of the NMOS transistor N12 is connected to the second clamp voltage line VL2.

The NMOS transistors N13 and N14 function as changeover switches at the time of initialization of the NC-side bit line BLNC, similarly to the NMOS transistors N5 to N8. Drain terminals of the NMOS transistors N13 and N14 are connected to the NC-side bit line BLNC, a source terminal of the NMOS transistor N13 is connected to the ground voltage Vss, and a source terminal of the NMOS transistor N14 is connected to the initial voltage line VLI. The inverted read signal/READ and the read signal READ are supplied to gate terminals of the NMOS transistors N13 and N14. As a result, the NMOS transistors N13 and N14 are complementarily turned on (turned off).

<<Control Circuit>>

Although the control circuit 1104 includes a plurality of circuit blocks, only circuit blocks necessary for description are illustrated in FIG. 1A. That is, the control circuit 1104 includes a timing control circuit TCNT, a clamp voltage generation circuit CLPG, and an initialization circuit VBLG.

The timing control circuit TCNT outputs the precharge signal/PC, the activation signal SAE, the read signal READ, and the inverted read signal/READ in accordance with instructions provided via the internal bus 1001 (FIG. 14).

The clamp voltage generation circuit CLPG generates a first clamp voltage VCL1 having a predetermined voltage value and a second clamp voltage VCL2 having a predetermined voltage value, and supplies the first clamp voltage VCL1 and the second clamp voltage VCL2 to the first clamp voltage line VL1 and the second clamp voltage line VL2. In addition, in a case of performing correction, the clamp voltage generation circuit CLPG supplies a bias signal VTRM having a predetermined voltage value to the current correction circuit TCP. As will be described in detail later, the voltage values of the first clamp voltage VCL1 and the second clamp voltage VCL2 are lower than the power supply voltage Vdd, and further, the voltage value of the first clamp voltage VCL1 is lower than the second clamp voltage VCL2.

In addition, the initialization circuit VBLG generates an initialization voltage VINI having a predetermined voltage value and supplies the initialization voltage VINI to the initial voltage line VLI in a standby period. As will be described in detail later, the voltage value of the initialization voltage VINI is lower than the power supply voltage Vdd.

In the following description, the PMOS transistors P1 and P2 may be referred to as first and second PMOS transistors. Similarly, the NMOS transistors N1 to N8 and N11 to N15 may be referred to as first to eighth NMOS transistors and 11th to 15th NMOS transistors.

<<Outline of Operation of Nonvolatile Storage Device>>

The outline of the read operation of the nonvolatile storage device including the sense amplifier SA illustrated in FIGS. 1A and 1B will be described using the waveform diagram illustrated in FIG. 1B.

In a standby period SBH before a time t0 at which the read operation is started, the read signal READ is at a low level. As a result, the NMOS transistors N5 and N6 are turned off, the NMOS transistors N7 and N8 are turned on, and the initialization voltage VINI having a voltage lower than the power supply voltage Vdd is supplied to the cell-side bit line BLC and the reference-side bit line BLR. As a result, in the standby period SBH, the cell-side bit line BLC, the reference-side bit line BLR, and the connection nodes CLC and CLR have voltages lower than the power supply voltage Vdd.

In the standby period SBH and a precharge period PTH from the time t0 to a time t1, the precharge signal/PC becomes a low level, whereby the PMOS transistors P1 and P2 of the precharge circuit PCK are turned on, and the cell-side sense line SAC, the reference-side sense line SAR, and the pair of sense nodes NI1 and NI2 of the amplification unit SAP are precharged to the power supply voltage Vdd.

In addition, in the precharge period PTH, since the read signal READ changes to a high level, the NMOS transistors N5 and N6 are turned on. As a result, the memory cell is connected to the cell-side bit line BLC via the column selector CSEL, and the reference resistor Rref is connected to the reference-side bit line BLR. The voltages of the cell-side bit line BLC, the reference-side bit line BLR, and the connection nodes CLC and CLR in the precharge period PTH are clamped by the first clamp voltage VCL1 and the second clamp voltage VCL2, and become lower than the power supply voltage Vdd as illustrated in FIG. 1B.

At the time t1, when the precharge signal/PC becomes a high level, the PMOS transistors P1 and P2 are turned off, the precharge of the cell-side sense line SAC and the reference-side sense line SAR ends, and the discharge period DTH starts. In the discharge period DTH from the time t1 to a time t2, the voltage of the cell-side sense line SAC decreases according to the cell current flowing through the selected memory cell, and the voltage of the reference-side sense line SAR decreases according to a reference current flowing through the reference resistor. As a result, a potential difference is generated between the pair of sense nodes NI1 and NI2 of the amplification unit SAP.

At the time t2, when the activation signal SAE becomes a high level, the amplification unit SAP amplifies the potential difference between the pair of sense nodes NI1 and NI2 and outputs the amplified potential difference as the output Dout.

In the noise cancellation circuit NCC, in the standby period SBH, the NMOS transistor N13 is turned on, and when transitioning to the precharge period PTH, the NMOS transistor N14 is turned on. As a result, when the transition is made from the standby period SBH to the precharge period PTH, as illustrated in FIG. 1B, the voltages of the NC-side bit line BLNC and the connection node CLNC rise from the ground voltage Vss to voltages determined by the first clamp voltage VCL1 and the second clamp voltage VCL2. That is, when transition is made from the standby period SBH to the precharge period PTH, as illustrated in FIG. 1B, the changing direction of the voltages of the NC-side bit line BLNC and the connection node CLNC is opposite to the changing direction of the voltages of the cell-side bit line BLC, the reference-side bit line BLR, and the connection nodes CLC and CLR. As a result, it is possible to apply voltage changes of opposite phases to the first clamp voltage line VL1 and the second clamp voltage line VL2 via, for example, the gate capacitance of the NMOS transistors N11 and N12, and it is possible to cancel noise.

Next, characteristic portions in the configuration according to the first embodiment illustrated in FIG. 1A will be described more specifically with reference to the drawings.

<<Clamp Circuit and Clamp Voltage Generation Circuit>>

Figure 2:
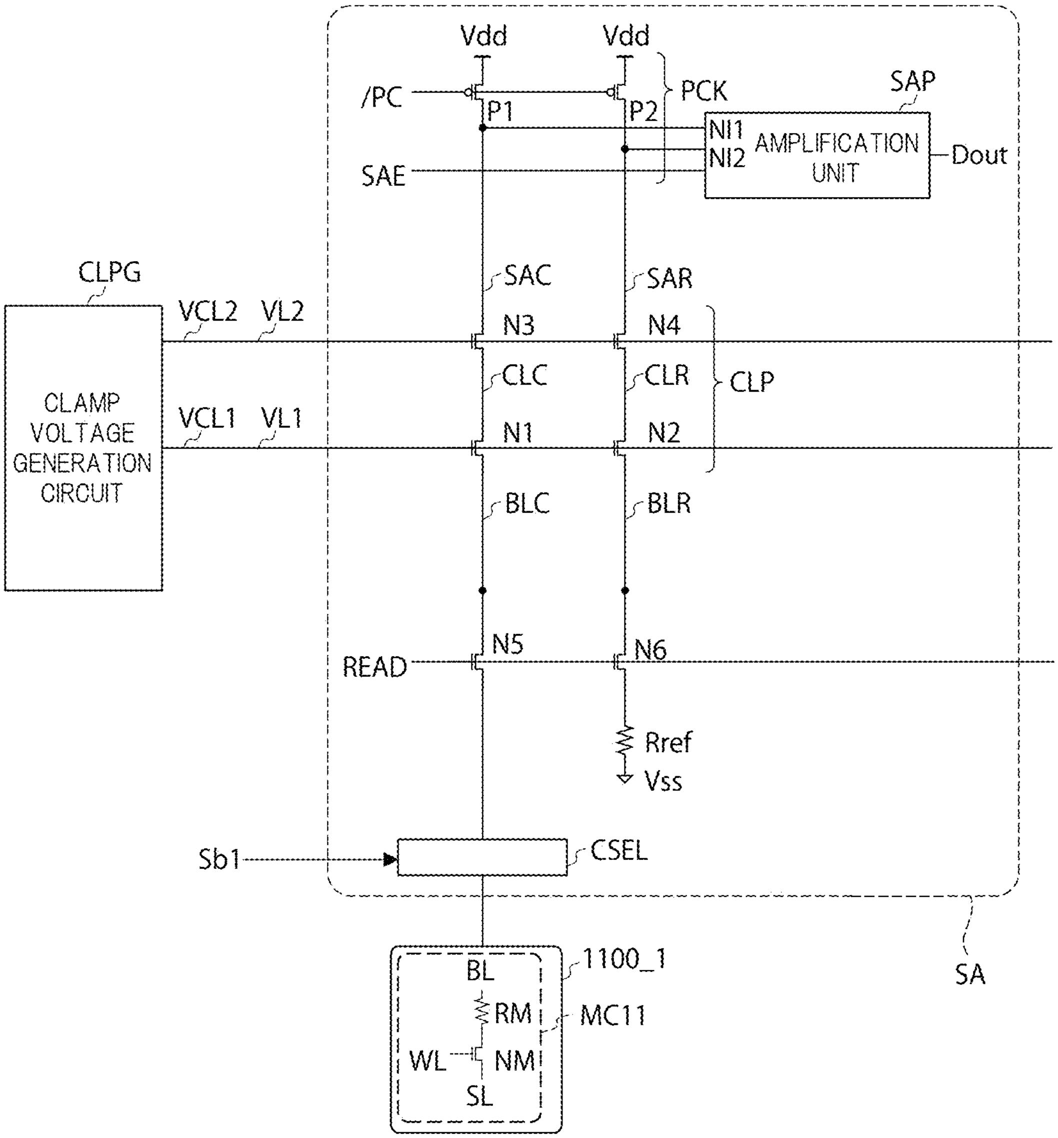
FIG. 2 is a circuit diagram illustrating a configuration of a clamp circuit and a clamp voltage generation circuit according to the first embodiment.

FIG. 2 is a circuit diagram illustrating a configuration of the clamp circuit and the clamp voltage generation circuit according to the first embodiment. FIG. 2 is similar to FIG. 1A. The main difference is that FIG. 2 illustrates only a portion related to the clamp circuit CLP in the circuit diagram illustrated in FIG. 1A.

In FIG. 1A, it has been described that the clamp voltage generation circuit CLPG generates a voltage lower than the power supply voltage Vdd as the first clamp voltage VCL1 and the second clamp voltage VCL2, but as a more specific example, in FIG. 2, a case of generating the first clamp voltage VCL1 and the second clamp voltage VCL2 having the following voltage values will be described.

That is, the clamp voltage generation circuit CLPG generates, as the first clamp voltage VCL1, a voltage having a voltage value obtained by adding the threshold voltage Vthn of the NMOS transistors N1 and N2 serving as the clamp elements to a voltage set for the cell-side bit line BLC and the reference-side bit line BLR. Here, the voltage set for the cell-side bit line BLC and the reference-side bit line BLR is the voltage Vbl (for example, about 0.1 V) applied to the selected memory cell (for example, the MC11). As a result, the clamp voltage generation circuit CLPG generates the first clamp voltage VCL1 having the voltage value (=Vbl+Vthn) obtained by adding the threshold voltage Vthn to the voltage Vbl. In addition, the clamp voltage generation circuit CLPG generates, as the second clamp voltage VCL2, a voltage having a voltage value (=Vcnd+Vth) obtained by adding the threshold voltage Vthn of the NMOS transistors N3 and N4 serving as the clamp elements to the voltage Vcnd set for the connection nodes CLC and CLR. The voltage Vcnd has a voltage value higher than the voltage Vbl by a DC saturation margin of the NMOS transistors N1 and N2, and is, for example, about 0.3 V.

As a result, during a period from the time t0 to a time t3 illustrated in FIG. 1B, that is, when the cell-side bit line BLC and the reference-side bit line BLR are connected to the memory cell MC11 and the reference resistor Rref via the NMOS transistors N5 and N6, the voltage of the cell-side bit line BLC and the reference-side bit line BLR is limited (clamped) to the voltage Vbl (about 0.1 V), and the voltage of the connection nodes CLC and CLR is limited (clamped)

to the voltage Vcnd (about 0.3 V). Here, for ease of explanation, a case where the threshold voltage of the NMOS transistors N1 and N2 and the threshold voltage of the NMOS transistors N3 and N4 are the same threshold voltage Vthn is taken as an example, but it is not limited thereto.

The clamp circuit CLP includes two sets (a set of N1 and N3 and a set of N2 and N4) of two cascode-connected NMOS transistors. Here, as described in FIG. 1A, the NMOS transistors N3 and N4 have a channel width W smaller than that of the NMOS transistors N1 and N2, and their transconductance Gm is set smaller than that of the NMOS transistors N1 and N2.

Since the transconductance Gm of the NMOS transistors N1 and N2 is set to be large, it is possible to increase the clamping accuracy when the voltage of the cell-side bit line BLC and the reference-side bit line BLR to which the source terminals thereof are connected is controlled to the voltage Vbl. In addition, by increasing the transconductance Gm, it is possible to improve the read margin as understood from the description of FIG. 16.

On the other hand, the NMOS transistors N3 and N4 connected to the pair of sense nodes via the cell-side sense line SAC and the reference-side sense line SAR have a shorter channel width W than the NMOS transistors N1 and N2 (for example, ¼ of the channel width W of the NMOS transistors N1 and N2). Therefore, a parasitic capacitance (for example, a drain capacitance of the NMOS transistors N3 and N4) connected to the pair of sense nodes can be reduced to, for example, ¼. As a result, since the discharge period DTH and the sense period STH illustrated in FIG. 1B can be shortened, it is possible to achieve the high-speed operation of the read operation.

Note that since the transconductance Gm of the NMOS transistors N3 and N4 decreases, the clamping accuracy at the time of limiting the connection nodes CLC and CLR to the voltage Vcnd decreases. However, since the voltage fluctuation of the connection nodes CLC and CLR due to the decrease in the clamping accuracy is the fluctuation when the NMOS transistors N1 and N2 are operating in a saturation region, there is no deterioration in the read margin due to this. Rather, the cascode-connection can improve the channel length modulation coefficient A and improve the current fluctuation when the voltage of the cell-side sense line SAC and the reference-side sense line SAR fluctuates.

In addition, since the two NMOS transistors N1 and N3 are connected to the connection node CLC and the two NMOS transistors N2 and N4 are also connected to the connection node CLR, a parasitic capacitance connected to the connection nodes CLC and CLR increases. However, since the voltage of the connection nodes CLC and CLR is limited to the voltage Vcnd by the NMOS transistors N3 and N4, a discharge time related to the connection nodes CLC and CLR does not increase.

<<<Example of Clamp Voltage Generation Circuit>>>

Figure 3:
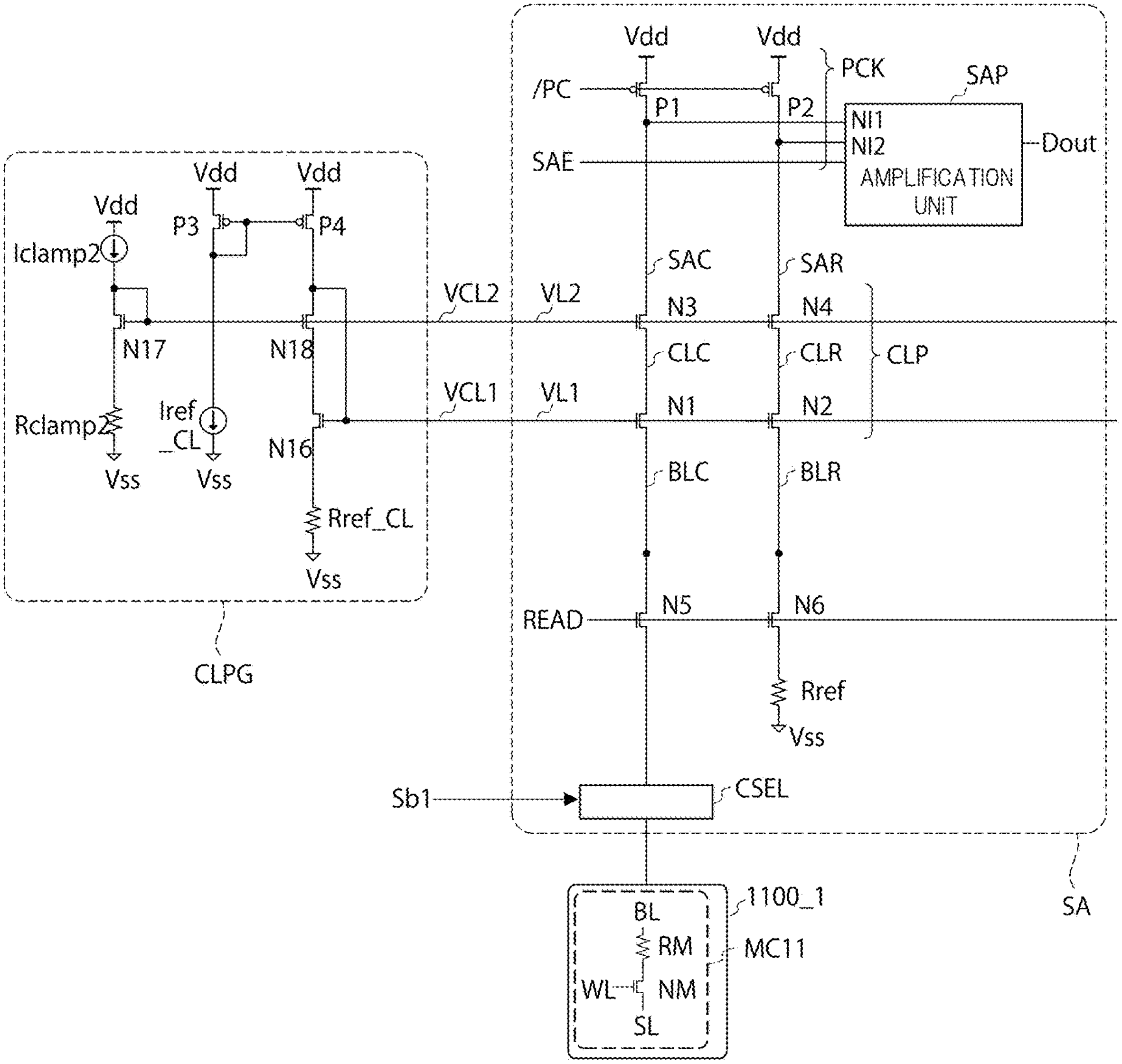
FIG. 3 is a circuit diagram illustrating a configuration of the clamp circuit and the clamp voltage generation circuit according to the first embodiment.

FIG. 3 is a circuit diagram illustrating a configuration of the clamp circuit and the clamp voltage generation circuit according to the first embodiment. FIG. 3 is similar to FIG. 2. The main difference is that FIG. 3 illustrates a detailed configuration example of the clamp voltage generation circuit CLPG. In FIG. 3, since the configuration of the sense amplifier SA is the same as that in FIG. 2, the description of the sense amplifier SA is omitted.

The clamp voltage generation circuit CLPG includes PMOS transistors P3 and P4, NMOS transistors N16 to N18, a reference resistor Rref_CL, a resistance element Rclamp2, a current source Iclamp2, and a reference current source Iref_CL.

Source terminals of the PMOS transistors P3 and P4 are connected to the power supply voltage Vdd, and a drain terminal of the PMOS transistor P3 is connected to gate terminals of the PMOS transistors P3 and P4. The drain terminal of the PMOS transistor P3 is connected to the ground voltage Vss via the reference current source Iref_CL. As a result, a current mirror circuit is configured by the PMOS transistors P3 and P4, and a reference current corresponding to the reference current Iref_CL is output from the drain terminal of the PMOS transistor P4.

A drain terminal of the NMOS transistor N18 is connected to the drain terminal of the PMOS transistor P4, a drain terminal of the NMOS transistor N16 is connected to a source terminal of the NMOS transistor N18, and a source terminal of the NMOS transistor N16 is connected to the ground voltage Vss via the reference resistor Rref_CL. A gate terminal of the NMOS transistor N16 is connected to the drain terminal of the PMOS transistor P4. Here, the NMOS transistor N16 is a replica element that simulates the NMOS transistors N1 and N2 serving as the clamp elements. The NMOS transistor N18 is a replica element that simulates the NMOS transistors N3 and N4 serving as the clamp elements. Therefore, the NMOS transistor N16 is set to have characteristics similar to those of the NMOS transistor N1, for example, and the NMOS transistor N18 is set to have characteristics similar to those of the NMOS transistor N3, for example.

Further, the reference resistor Rref_CL is a replica element that simulates the reference resistor Rref. Therefore, the reference resistor Rref_CL is set to have characteristics similar to those of the reference resistor Rref.

The reference current output from the drain terminal of the PMOS transistor P4 is supplied to a series circuit configured by the NMOS transistors N18 and N16 and the reference resistor Rref_CL. As a result, a voltage corresponding to the voltage Vbl (about 0.1 V) applied to the memory cell is generated at the source terminal of the NMOS transistor N16. Since the first clamp voltage line VL1 is connected to the gate terminal of the NMOS transistor N16, the value of the first clamp voltage VCL1 supplied from the clamp voltage generation circuit CLPG to the first clamp voltage line VL1 is a voltage (=Vbl+Vthn) obtained by adding the threshold voltage Vthn of the NMOS transistor to the voltage Vbl (about 0.1 V) at the source terminal of the NMOS transistor N16.

A gate terminal of the NMOS transistor N17 is connected to a drain terminal of the NMOS transistor N17 and a gate terminal of the NMOS transistor N18, and the drain terminal of the NMOS transistor N17 is connected to the power supply voltage Vdd via the current source Iclamp2. Furthermore, a source terminal of the NMOS transistor N17 is connected to the ground voltage Vss via the resistance element Rclamp2. Here, the NMOS transistor N17 is a replica element that simulates the NMOS transistors N3 and N4 serving as the clamp elements. Therefore, the NMOS transistor N17 is set to have characteristics similar to those of the NMOS transistor N3, for example.

The current source Iclamp2 and the resistance element Rclamp2 are set such that the voltage generated in the resistance element Rclamp2 by the current supplied from the current source Iclamp2 to the resistance element Rclamp2 via the NMOS transistor N17 is equal to the voltage Vcnd at the connection nodes CLC and CLR. As a result, the voltage at the source terminal of the NMOS transistor N17 has a value equal to the voltage Vcnd (about 0.3 V). Since the second clamp voltage line VL2 is connected to the gate terminal of the NMOS transistor N17, the second clamp voltage VCL2 becomes a value (=Vcnd+Vthn) obtained by adding the threshold voltage Vthn of the NMOS transistor N17 to a voltage value (about 0.3 V) equal to the voltage Vcnd.

As described with reference to FIG. 1A, since a parasitic capacitance connected to the cell-side sense line SAC and the reference-side sense line SAR can be reduced, both the stable operation and the high-speed operation can be achieved.

In addition, the clamp voltage generation circuit CLPG illustrated in FIG. 2 generates the first clamp voltage VCL1 and the second clamp voltage VCL2 by using the replica elements of the NMOS transistors N1 to N4 serving as the clamp elements and the replica element of the reference resistor Rref. Therefore, even when the characteristics of the NMOS transistors N1 to N4 and the reference resistor Rref fluctuate, for example, at the time of manufacturing, the clamp voltage generation circuit CLPG can generate the first clamp voltage VCL1 and the second clamp voltage VCL2 in accordance with the fluctuation, and the stability of the operation can be further improved.

<<Current Correction Circuit>>

Figure 4:
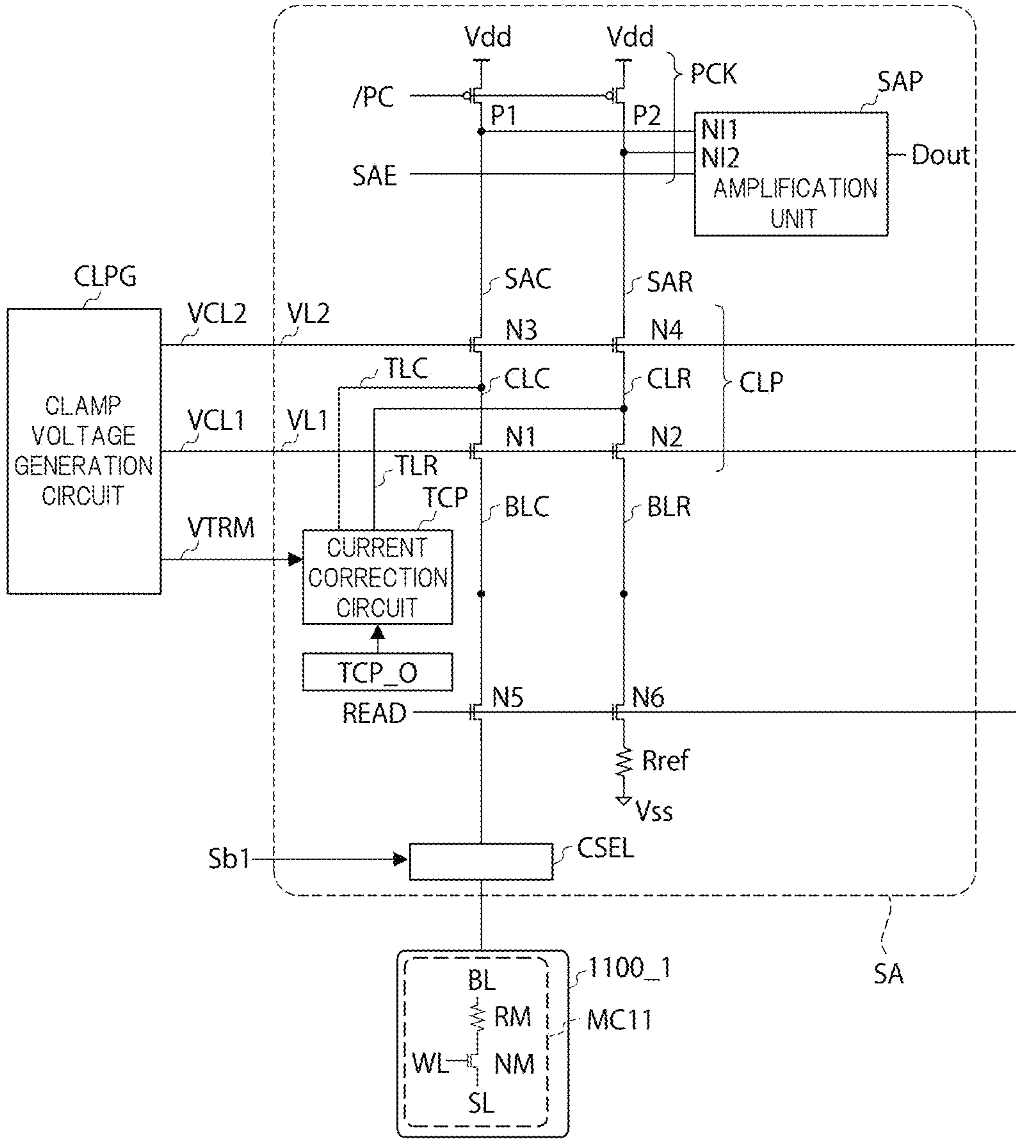
FIG. 4 is a circuit diagram illustrating a configuration of a current correction circuit according to the first embodiment.

FIG. 4 is a circuit diagram illustrating a configuration of a current correction circuit according to the first embodiment. FIG. 4 is similar to FIG. 2. The main difference is that in FIG. 4, parts related to the current correction circuit are added to FIG. 2.

An input offset may occur in the amplification unit SAP due to characteristic variations among the clamp elements configuring the clamp circuit CLP, for example, a characteristic variation between the NMOS transistors N1 and N2, and/or a characteristic variation among the elements (for example, MOS transistors) configuring the amplification unit SAP.

For example, when the input offset occurs due to the characteristic variation between the NMOS transistors N1 and N2, a potential difference occurs between the pair of sense nodes NI1 and NI2 even when the cell resistance and the reference resistor have the same value. In addition, for example, when the input offset occurs due to the elements configuring the amplification unit SAP, even when there is no potential difference between the pair of sense nodes NI1 and NI2, the amplification unit SAP outputs an undesirable output Dout, and decreases the read margin during the read operation of the memory cell at the time of a high resistance and/or the read operation of the memory cell at the time of a low resistance.

In the first embodiment, the current correction circuit TCP is provided in the sense amplifier SA. Although not particularly limited, the sense amplifier SA is further provided with the correction information storage circuit TCP_O. The correction information storage circuit TCP_O stores correction information in advance. The correction information is supplied from the correction information storage circuit TCP_O to the current correction circuit TCP. The current correction circuit TCP generates a minute correction current based on the supplied correction information and the bias signal VTRM supplied from the clamp voltage generation circuit CLPG, and supplies the generated correction current to the connection node CLC and/or the connection node CLR via the correction current lines TLC and TLR.

By supplying the correction current to the connection node CLC and/or the connection node CLR, the cell current flowing through the cell-side sense line SAC and/or the reference current flowing through the reference-side sense line SAR are corrected during the read operation, the input offset can be reduced, and the read margin can be improved.

By connecting the correction current lines TLC and TLR to the connection nodes CLC and CLR, the parasitic capacitance connected to the connection nodes CLC and CLR increases. However, since the voltage of the connection nodes CLC and CLR is clamped to the voltage Vcnd (about 0.3 V) by the NMOS transistors N3 and N4 serving as the clamp elements, the discharge time for discharging the connection nodes CLC and CLR does not increase.

The correction current lines TLC and TLR are connected to, for example, the cell-side sense line SAC and the reference-side sense line SAR, and the correction current is supplied to the sense lines SAC and SAR, whereby the input offset can be reduced. However, in this case, the parasitic capacitance generated by the correction current lines TLC, TLR, and the like is connected to the sense lines SAC and SAR, and the parasitic capacitance connected to the pair of sense nodes increases, and a discharge time of the sense lines SAC and SAR increases, and the high-speed operation of the read operation is limited.

In addition, the correction current lines TLC and TLR are connected to, for example, the cell-side bit line BLC and the reference-side bit line BLR, and the correction current is supplied to the bit lines BLC and BLR, whereby the input offset can be reduced. However, in this case, the current correction circuit TCP is required to generate a correction current with a very low voltage Vbl (about 0.1 V) applied to the memory cell, and it becomes difficult to configure the current correction circuit TCP.

Therefore, as illustrated in FIG. 4, the correction current lines TLC and TLR to which the correction current is supplied are desirably connected to the connection nodes CLC and CLR.

<<<Example of Current Correction Circuit>>>

Figure 5:
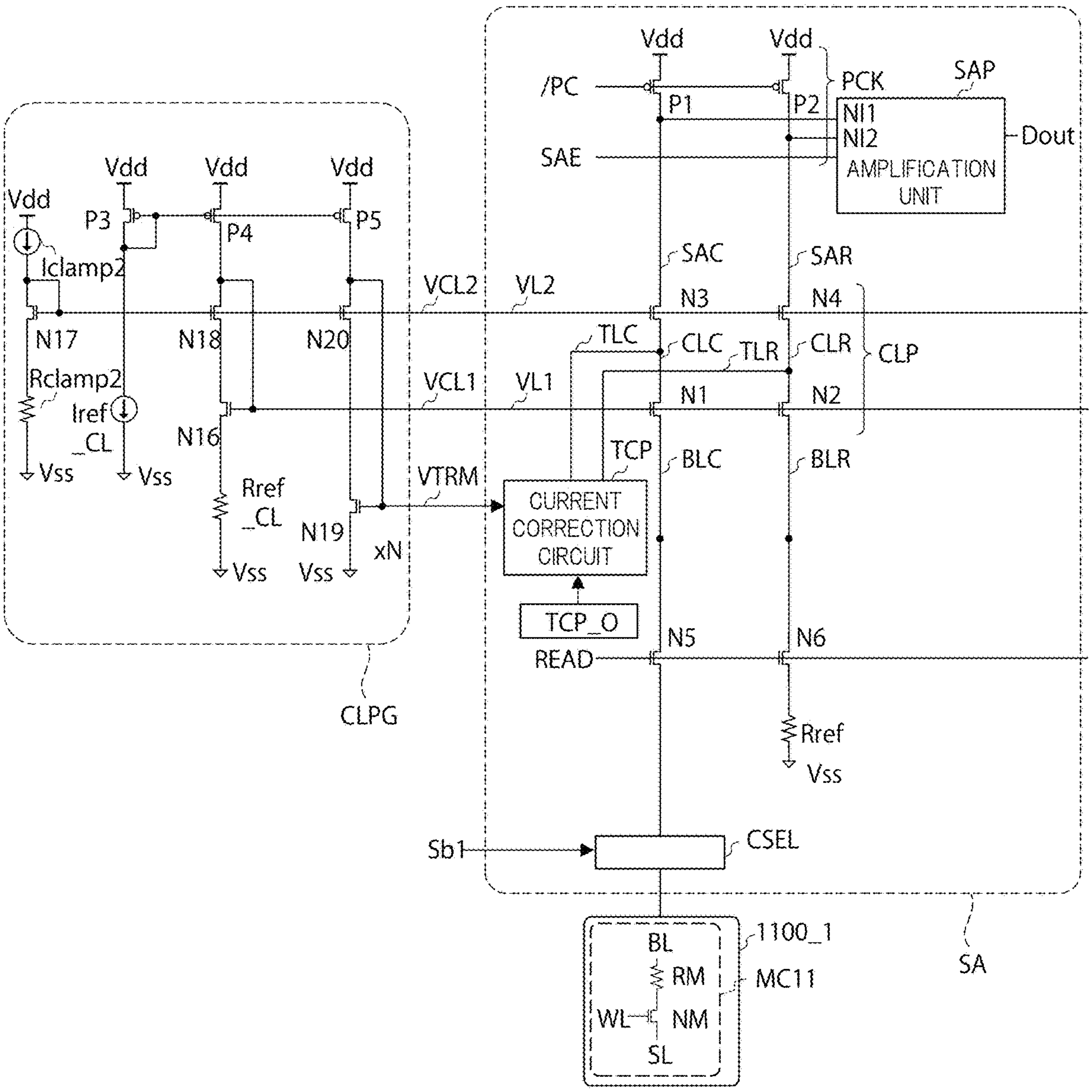
FIG. 5 is a diagram for describing the current correction circuit according to the first embodiment.
Figure 6:
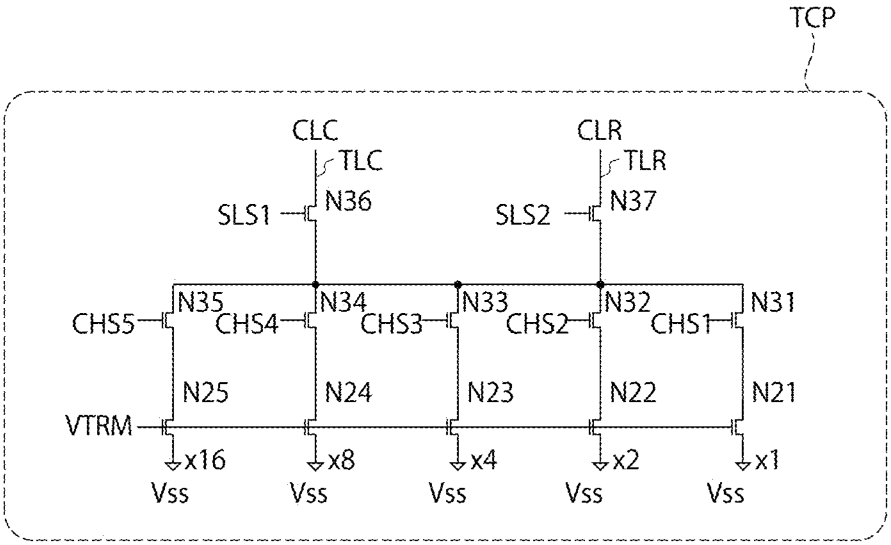
FIG. 6 is a diagram for describing the current correction circuit according to the first embodiment.

FIGS. 5 and 6 are diagrams for describing the current correction circuit according to the first embodiment. Here, FIG. 5 illustrates a configuration of the clamp voltage generation circuit that generates a bias signal to be supplied to the current correction circuit. FIG. 6 is a circuit diagram illustrating a configuration of the current correction circuit illustrated in FIG. 5.

FIG. 5 is similar to FIG. 4. The main difference is that FIG. 5 illustrates a detailed configuration of the clamp voltage generation circuit CLPG. The clamp voltage generation circuit CLPG illustrated in FIG. 5 is similar to the clamp voltage generation circuit illustrated in FIG. 3. The main difference is that FIG. 5 illustrates a configuration for generating a bias signal to be supplied to the current correction circuit.

In order to generate the bias signal VTRM supplied to the current correction circuit TCP, in the clamp voltage generation circuit CLPG illustrated in FIG. 5, the PMOS transistor P5 and the NMOS transistors N19 and N20 are added to the clamp voltage generation circuit CLPG of FIG. 3.

A source terminal of the PMOS transistor P5 is connected to the power supply voltage Vdd, and a gate terminal thereof is connected to the gate terminal of the PMOS transistor P3. A drain terminal of the PMOS transistor P5 is connected to a drain terminal of the NMOS transistor N20, a source terminal of the NMOS transistor N20 is connected to a drain terminal of the NMOS transistor N19, and a source terminal of the NMOS transistor N19 is connected to the ground voltage Vss. A gate terminal of the NMOS transistor N19 is connected to the drain terminal of the PMOS transistor P5, and a gate terminal of the NMOS transistor N20 is connected to the gate terminal of the NMOS transistor N17. The bias signal VTRM is extracted from the gate terminal of the NMOS transistor N19 (the drain terminal of the PMOS transistor P5).

Similarly to the NMOS transistors N17 and N18, the NMOS transistor N20 is a replica element that simulates the NMOS transistors N3 and N4 serving as the clamp elements.

A current mirror circuit is configured by the PMOS transistors P3 to P5, and a current mirror current corresponding to the reference current Iref_CL is supplied from the PMOS transistor P5 to the NMOS transistors N20 and N19 connected in series. As a result, the bias signal VTRM is output from the gate terminal of the NMOS transistor N19.

The current correction circuit TCP illustrated in FIG. 6 includes NMOS transistors N21 to N25 and N31 to N37.

Source terminals of the NMOS transistors N21 to N25 are connected to the ground voltage Vss, and gate terminals thereof are connected to the gate terminal of the NMOS transistor N19 illustrated in FIG. 5 so that the bias signal VTRM is supplied. As a result, the NMOS transistors N19 and N21 to N25 configure a current mirror circuit, and the NMOS transistors N21 to N25 function as current sources.

In the first embodiment, with a size of the NMOS transistor N21 as a reference (×1), sizes of the NMOS transistors N22 to N25 are set to two times (×2), four times (×4), eight times (×8), and 16 times (×16) the size of the reference (×1). A size of the NMOS transistor N19 illustrated in FIG. 5 is set to N times (×N) the reference (×1).

Drain terminals of the NMOS transistors N21 to N25 are connected to source terminals of the NMOS transistors N31 to N35, and drain terminals of the NMOS transistors N31 to N35 are connected to source terminals of the NMOS transistors N36 and N37. A drain terminal of the NMOS transistor N36 is connected to the connection node CLC via the correction current line TLC, and a drain terminal of the NMOS transistor N37 is connected to the connection node CLR via the correction current line TLR.

Gate terminals of the NMOS transistors N31 to N35 and gate terminals of the NMOS transistors N36 and 37 are connected to the correction information storage circuit TCP_O. The correction information stored in the correction information storage circuit TCP_O is supplied to the gate terminals of the NMOS transistors N31 to N35 and N36 and N37 as switching signals CHS1 to CHS5 and selection signals SLS1 and SLS2. The NMOS transistors N31 to N35 and N36 and N37 have the same size, the NMOS transistors N31 to N35 function as switches that are turned on by setting the switching signals CHS1 to CHS5 to a high level, and the NMOS transistors N36 and N37 function as switches that are turned on by setting the selection signals SLS1 and SLS2 to a high level.

By combining the high levels of the switching signals CHS1 to CHS5, 32 different settings can be made, and it is possible to adjust the size from 0 times to 31 times. For example, in a case where N that is the size of the NMOS transistor N19 is set to 256 (N=256), it is possible to generate a minute correction current ranging from 0 and 1/256×reference current Iref_CL (FIG. 5) to 31/256×reference current Iref_CL by combining the high levels in the switching signals CHS1 to CHS5. The generated correction current can be supplied to, for example, the connection node CLC or CLR by the selection signals SLS1 and SLS2 to perform correction.

In a case where the read margin when the memory cell has a low resistance is reduced due to the input offset, the selection signal SLS1 is set to a high level so that the minute correction current is applied to the connection node CLC. As a result, the cell current Icell can be increased during the read operation. On the other hand, in a case where the read margin when the memory cell has a high resistance is small due to the input offset, the selection signal SLS2 is set to a high level so that the minute correction current is applied to the connection node CLR. As a result, it is possible to increase the reference current Iref generated in the reference resistor Rref (FIG. 5) during the read operation. By supplying the minute correction current to the connection node, it is possible to improve the read margin by equalizing the read margin when the memory cell has a high resistance and the read margin when the memory cell has a low resistance.

In the clamp voltage generation circuit CLPG illustrated in FIG. 5 and the current correction circuit TCP illustrated in FIG. 6, current mirrors are formed by the NMOS transistors N19 and N20, N21 to N25, and N3 and N4, and even when the characteristics of the NMOS transistors fluctuate, for example, at the time of manufacturing, it is possible to generate a correction current according to the fluctuation, and it is possible to improve the stability of the operation.

<<Initialization Circuit>>

Figure 7:
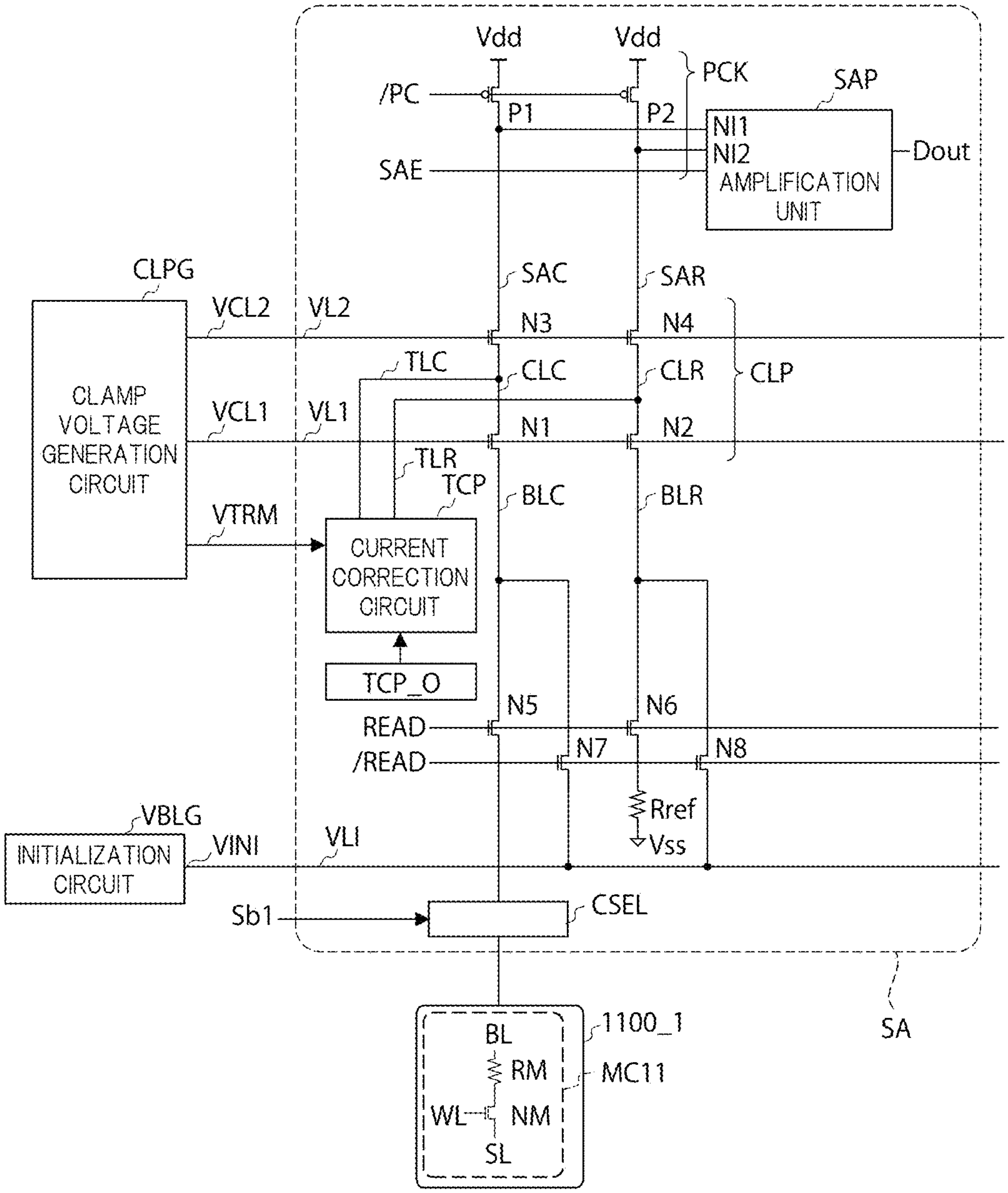
FIG. 7 is a diagram for describing an initialization circuit according to the first embodiment.

FIG. 7 is a diagram for describing the initialization circuit according to the first embodiment. FIG. 7 is similar to FIG. 4. The difference is that in FIG. 7, parts related to the initialization circuit are added to FIG. 4. That is, in FIG. 7, the initialization circuit VBLG, the initial voltage line VLI to which the initialization voltage VINI generated by the initialization circuit VBLG is supplied, and the NMOS transistors N7 and N8 are illustrated as the parts related to the initialization circuit.

Figure 8A:
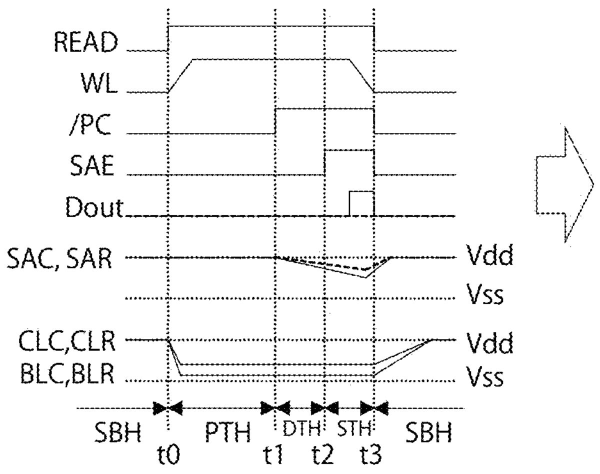
FIGS. 8A and 8B are waveform diagrams for describing the initialization circuit according to the first embodiment.
Figure 8B:
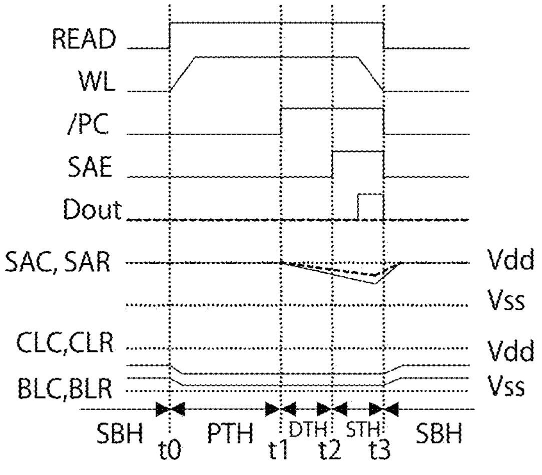

FIGS. 8A and 8B are waveform diagrams for describing the initialization circuit according to the first embodiment. FIGS. 8A and 8B are similar to FIG. 1B. The difference is that waveforms of the NC-side sense line and the NC-side bit line are omitted in FIGS. 8A and 8B. Here, FIG. 8A illustrates the operation of the circuit illustrated in FIG. 4, for example, and FIG. 8B illustrates the operation of the circuit illustrated in FIG. 7.

The initialization circuit VBLG generates the initialization voltage VINI and supplies the initialization voltage VINI to the initial voltage line VLI. A voltage of the initialization voltage VINI is lower than the power supply voltage Vdd, and is, for example, about a voltage Vbl (about 0.1 V)+0.2 V.

As illustrated in FIG. 7, the NMOS transistor N7 is connected between the initial voltage line VLI and the cell-side bit line BLC, and the NMOS transistor N8 is connected between the initial voltage line VLI and the reference-side bit line BLR. The inverted read signal/READ is supplied to the gate terminals of the NMOS transistors N7 and N8. Therefore, in the standby period SBH (FIGS. 8A and 8B) in which the read signal READ is at a low level, the NMOS transistors N7 and N8 are turned on. As a result, in the standby period SBH, the voltage of the cell-side bit line BLC and the reference-side bit line BLR has a voltage value determined by the initialization voltage VINI.

In the standby period SBH, since the read signal READ becomes a low level, the NMOS transistors N5 and N6 are turned off. Therefore, when the initialization voltage VINI is not supplied via the NMOS transistors N7 and N8, the cell-side bit line BLC and the reference-side bit line BLR are in a floating state, and as illustrated in FIG. 8A, for example, rise toward the power supply voltage Vdd to become the power supply voltage Vdd. Thereafter, the voltage of the cell-side bit line BLC and the reference-side bit line BLR changes from the power supply voltage Vdd to the voltage Vbl determined by the first clamp voltage VCL1 at the time t0 when the read operation is started. That is, when transitioning from the standby period to the read operation, an amount of change in the voltage in the cell-side bit line BLC and the reference-side bit line BLR increases. The change in the voltage in the bit line is transmitted to the first clamp voltage line VL1 via a gate capacitance (a capacitance between the source terminal and the gate terminal) of the NMOS transistors N1 and N2, for example, and becomes noise, for example.

On the other hand, in the configuration of FIG. 7, in the standby period SBH, the initialization voltage VINI of the voltage (voltage Vbl (about 0.1 V)+0.2 V) lower than the power supply voltage Vdd is supplied to the cell-side bit line BLC and the reference-side bit line BLR. Therefore, as illustrated in FIG. 8B, when transitioning from the standby period to the read operation, the amount of change in the voltage of the cell-side bit line BLC and the reference-side bit line BLR can be reduced (to about 0.2 V). As a result, the noise transmitted to the first clamp voltage line VL1 via the gate capacitance can be reduced.

In the configuration of FIG. 7 in which the initialization voltage VINI having the voltage (voltage Vbl (about 0.1 V)+0.2 V) lower than the power supply voltage Vdd is supplied to the cell-side bit line BLC and the reference-side bit line BLR in the standby period SBH, the voltage at the connection nodes CLC and CLR transitions from about 0.5 V (standby period SBH) to about 0.3 V (period of read operation) as illustrated in FIG. 8B. That is, the amount of change in the voltage at the connection nodes CLC and CLR can also be reduced, and the noise can be reduced.

Since it is possible to shorten a time for waiting for convergence of the noise by reducing the noise, for example, it is possible to shorten the precharge period PTH from the time t0 to the time t1 and to achieve the high-speed operation. Alternatively, since it is possible to reduce the fluctuation of the first clamp voltage VCL1 and the second clamp voltage VCL2 due to the noise, it is possible to improve the read margin by suppressing the fluctuation of the cell current after the time t1.

<<<Configuration Example of Initialization Circuit>>>

Figure 9:
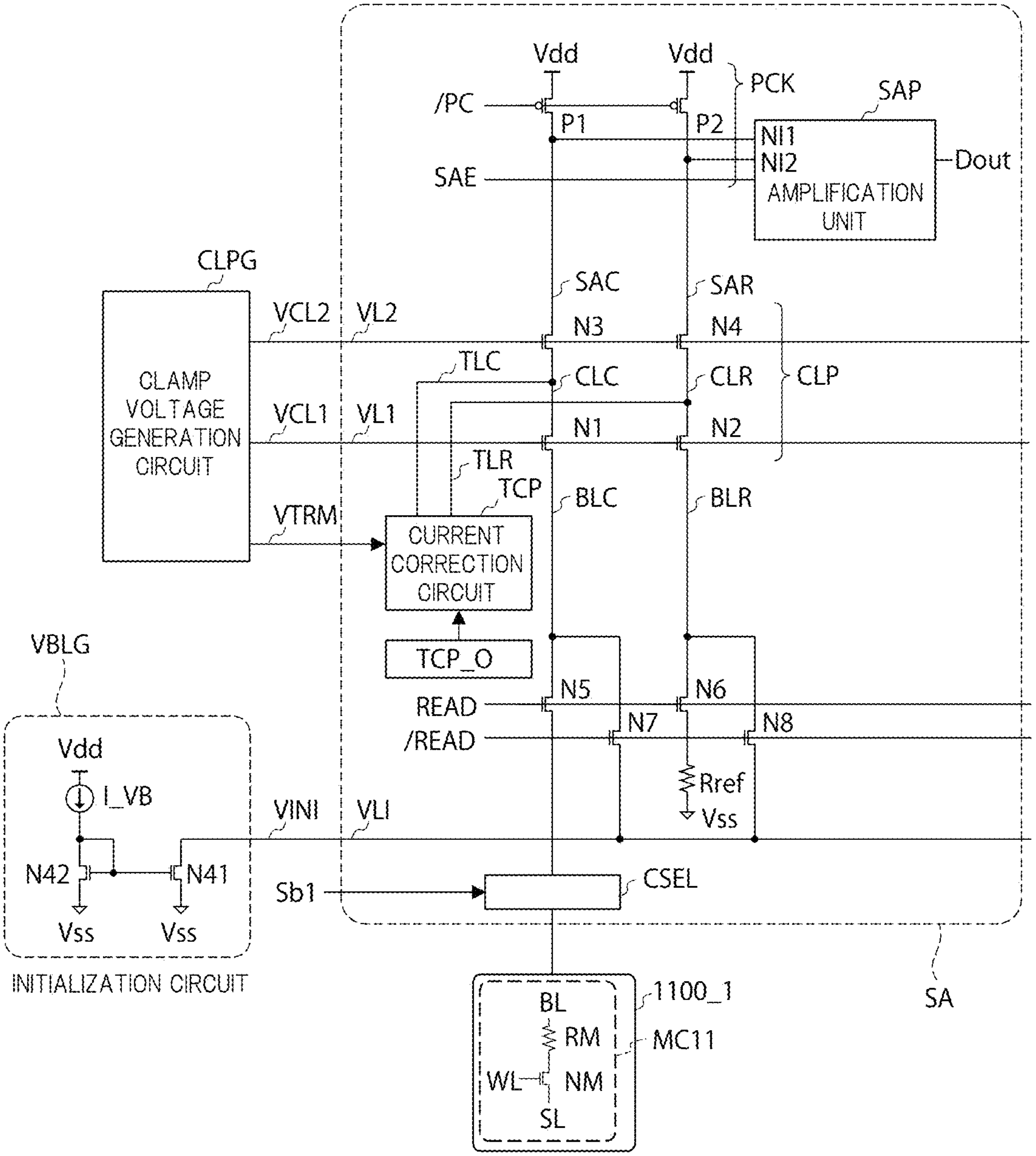
FIG. 9 is a circuit diagram illustrating an example of the initialization circuit according to the first embodiment.

FIG. 9 is a circuit diagram illustrating an example of the initialization circuit according to the first embodiment. FIG. 9 is similar to FIG. 7. The difference is that the configuration of the initialization circuit VBLG is clearly illustrated in FIG. 9.

The initialization circuit VBLG includes a current source I_VB and NMOS transistors N41 and N42. A source terminal of the NMOS transistor N42 is connected to the ground voltage Vss, and a drain terminal thereof is connected to the power supply voltage Vdd via the current source I_VB. A source terminal of the NMOS transistor N41 is connected to the ground voltage Vss, and a drain terminal thereof is connected to the initial voltage line VLI. Furthermore, gate terminals of the NMOS transistors N41 and N42 are connected to the drain terminal of the NMOS transistor N42. Thus, the NMOS transistors N41 and N42 configure a current mirror circuit.

In the first embodiment, the initialization circuit VBLG is shared by a plurality of sense amplifiers. In the example illustrated in FIG. 13, one initialization circuit VBLG is provided for k input/output circuits 1103_1 to 1103_*k*.

When the NMOS transistors N7 and N8 are turned on, a current flows from the power supply voltage Vdd to the initial voltage line VLI via the PMOS transistors P1 and P2, the NMOS transistors N3 and N4, the NMOS transistors N1 and N2, and the NMOS transistors N7 and N8, and further, the current flows to the ground voltage Vss via the NMOS transistor N41.

The NMOS transistor N41 functions as a current source through which a current of 4 μA flows, for example. Therefore, for example, in a case where it is assumed that one initialization circuit VBLG is shared by 256 sense amplifiers, a current of 7 nA is allocated to one NMOS transistor functioning as the clamp element. The first clamp voltage VCL1 is applied to the NMOS transistors N1 and N2 even in the standby period SBH before the time t0, and by causing the current of 7 nA to flow, about 0.3 V, which is the initialization voltage VINI, is automatically generated in the initial voltage line VLI to which the source terminals of the NMOS transistors N1 and N2 are connected.

As described above, the initialization circuit VBLG can be realized by adding the current source and the NMOS transistor without adding a complicated circuit, and can be shared by a plurality of sense amplifiers. Therefore, it is possible to suppress the increase in the occupied area and the power consumption.

<<Noise Cancellation Circuit>>

Next, the noise cancellation circuit NCC illustrated in FIGS. 1A and 1B will be described with reference to FIG. 7 and FIGS. 8A and 8B. As illustrated in FIG. 1A, the noise cancellation circuit NCC includes the NMOS transistors N11 to N15. Here, the NMOS transistors N11 and N12 are replica elements that simulate the NMOS transistors N1 and N2 and N3 and N4 serving as the clamp elements. Therefore, the NMOS transistors N11 and N12 are set to have characteristics similar to those of the NMOS transistors N1 and N3, for example.

As described in FIG. 7 and FIGS. 8A and 8B, at the time t0 when transitioning from the standby period SBH to the read operation, the voltage of the cell-side bit line BLC and the reference-side bit line BLR transitions from about 0.3 V (=voltage Vbl (about 0.1 V)+about 0.2V) to about 0.1 V (=voltage Vbl). In addition, the voltage of the connection nodes CLC and CLR transitions from about 0.5 V to about 0.3 V at the time t0. The voltage transition in the cell-side bit line BLC and the reference-side bit line BLR is propagated to the first clamp voltage line VL1 via the gate capacitance of the NMOS transistors N1 and N2, and the voltage transition in the connection nodes CLC and CLR is propagated to the second clamp voltage line VL2 via the NMOS transistors N3 and N4.

Since the voltage transition at the time t0 is a negative change from a high voltage value to a low voltage value as illustrated in FIGS. 8A and 8B, the voltage transition acts as negative noise application to the first clamp voltage VCL1 and the second clamp voltage VCL2.

On the other hand, in the noise cancellation circuit NCC, at the time t0 when transitioning from the standby period SBH to the read operation, the NMOS transistor N13 is switched to the off state, and the NMOS transistors N14 and N15 are switched to the on state. As a result, the voltages of the NC-side bit line BLNC and the connection node CLNC rise from the ground voltage Vss to the voltage determined by the initialization voltage VINI. That is, the voltage of the connection node CLNC transitions from the ground voltage Vss to about 0.5V, and the voltage of the NC-side bit line BLNC transitions from the ground voltage Vss to about 0.3 V.

The transition of the voltage at the NC-side bit line BLNC is transmitted to the first clamp voltage line VL1 via the gate capacitance of the NMOS transistor N11, and the transition of the voltage at the connection node CLNC is transmitted to the second clamp voltage line VL1 via the gate capacitance of the NMOS transistor N12. Since the transition at the time t0 is a positive change from a low voltage value to a high voltage value as illustrated in FIGS. 8A and 8B, the voltage transition acts as positive noise application to the first clamp voltage VCL1 and the second clamp voltage VCL2.

Since both the negative noise and the positive noise are applied to the first clamp voltage line VL1 and the second clamp voltage line VL2, it is possible to cancel out the noise.

Since the noise is reduced by the cancellation, it is possible to shorten the time for waiting for the convergence of the noise, and thus, it is possible to shorten the precharge period PTH from the time t0 to the time t1, for example, to achieve the high-speed operation. Alternatively, since it is possible to reduce the fluctuation of the first clamp voltage VCL1 and the second clamp voltage VCL2 due to the noise, it is possible to improve the read margin by suppressing the fluctuation of the cell current after the time t1.

In addition, since the NMOS transistors N11 and N12 are replica elements of the NMOS transistors N1 to N4, for example, when the gate capacitance of the NMOS transistors N1 to N4 changes due to the fluctuation at the time of manufacturing, the gate capacitance of the NMOS transistors N11 and N12 also changes in a similar manner, and thus, it is possible to prevent an amount of noise to be canceled out from being reduced due to the fluctuation at the time of manufacturing.

The NMOS transistors N5 to N8 and N13 and N14 can be regarded as configuring a selection circuit. The selection circuit changes the connection to the cell-side bit line BLC, the reference-side bit line BLR, and the NC-side bit line BLNC between the standby time and the reading time.

According to the first embodiment, it is possible to provide a semiconductor device including an MRAM capable of achieving both a high-speed operation and a stable operation at a high temperature. Therefore, an application range of the semiconductor device can be expanded, and a commercial value can be increased. For example, an end point device in network communication with a cloud is often required to perform high-speed data processing in a severe surrounding environment. The semiconductor device including the MRAM according to the first embodiment can also be used for such an end point device.

Second Embodiment

In a second embodiment, a preferred example of the reference resistor Rref used in the sense amplifier SA (for example, FIG. 1A) will be described. The reference resistor Rref is set to have an intermediate resistance value between the resistance value when the memory cell (for example, the MC11) has a high resistance and the resistance value when the memory cell has a low resistance. In order to enable such setting, the reference resistor Rref includes an adjustment function unit that adjusts the resistance value.

The present inventors have studied a reference resistor including such an adjustment function unit. First, the study of the present inventors will be described using a comparative example.

Comparative Example of Reference Resistor

Figures 16, 17:
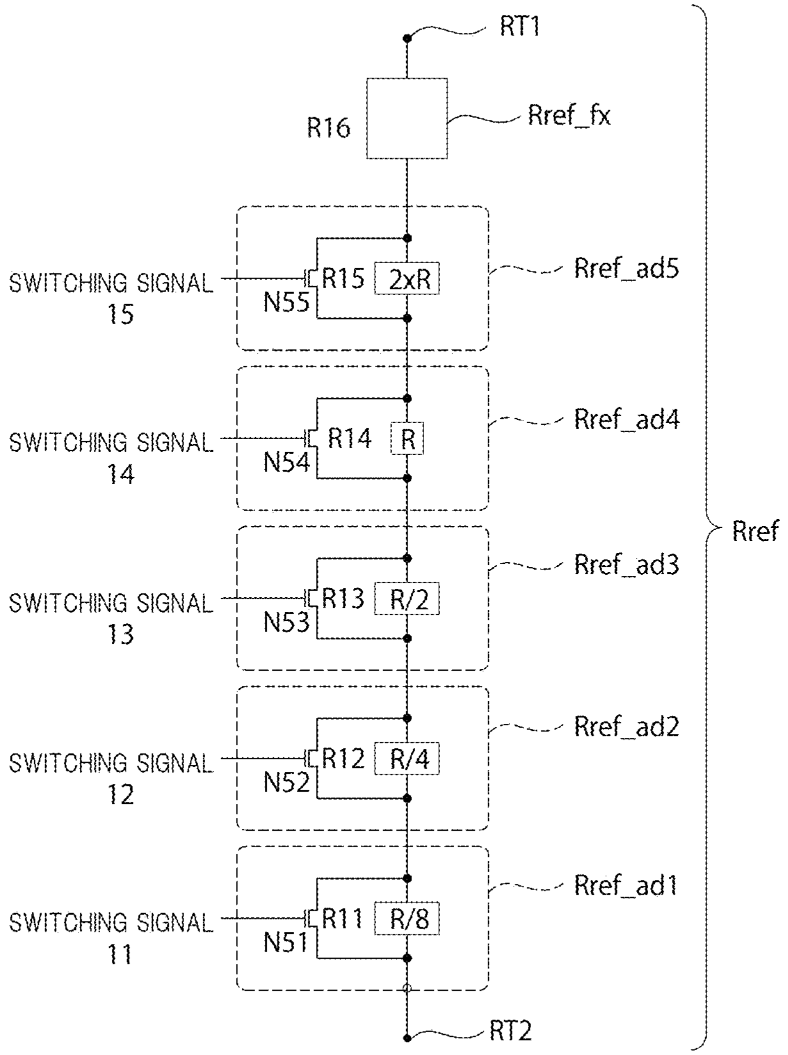
FIG. 16 is a diagram illustrating a mathematical expression for describing the comparative example.
FIG. 17 is a circuit diagram illustrating a configuration of a reference resistor indicating the comparative example studied by the present inventors.

FIG. 17 is a circuit diagram illustrating the comparative example of the reference resistor studied by the present inventors. As illustrated in FIG. 17, the reference resistor Rref of the comparative example is configured by a resistance value fixing unit Rref_fx and five resistance value adjustment units Rref_ad1 to Rref_ad5 connected in series between terminal nodes RT1 and RT2 of the reference resistor Rref. The adjustment function unit is realized by the five resistance value adjustment units.

The resistance value fixing unit Rref_fx and the resistance value adjustment units Rref_ad1 to Rref_ad5 are basically configured by polysilicon resistors (hereinafter, also referred to a polyresistor) having substantially the same as characteristics as the resistance element RM (FIG. 1A) configuring the memory cell (MC11). A sheet resistance of the polyresistor is relatively large, about 1 kΩ. Each of the resistance value adjustment units Rref_ad1 to Rref_ad5 is configured by a resistance configured using a basic resistor R and a short-circuit switch. Hereinafter, a case where the basic resistor R is configured by a 1 kΩ polyresistor will be described.

In the resistance value adjustment unit Rref_ad1, a resistor R11 is configured by eight basic resistors R connected in parallel. As a result, the resistor R11 having a resistance value of about 125 Ω is realized. In order to realize an adjustment function with a resolution of 125Ω, the resistor R11 and an NMOS transistor N51 are connected in parallel. The short-circuit switch is configured by the NMOS transistor N51, and the short-circuit switch is turned on/off by a switching signal 11 supplied to a gate terminal of the NMOS transistor N51. As a result, addition/non-addition of the resistance value having the resolution of 125 Ω to the reference resistor Rref is determined by the switching signal 11.

Similarly, in the resistance value adjustment unit Rref_ad2, a resistor R12 is configured by four basic resistors R connected in parallel, and an NMOS transistor N52 configuring the short-circuit switch is connected in parallel with the resistor R12. Hereinafter, in the resistance value adjustment unit Rref_ad3, a resistor R13 is configured by two basic resistors R connected in parallel, and the resistor R13 and an NMOS transistor N53 configuring the short-circuit switch are connected in parallel. In the resistance value adjustment unit Rref_ad4, a resistor R14 is configured by one basic resistor R, and the resistor R14 and an NMOS transistor N54 configuring the short-circuit switch are connected in parallel. Furthermore, in the resistance value adjustment unit Rref_ad5, a resistor R15 is configured by two basic resistors R connected in series, and the resistor R15 and an NMOS transistor N55 configuring the short-circuit switch are connected in parallel.

By connecting these resistance value adjustment units Rref_ad1 to Rref_ad5 and the resistance value fixing unit Rref_fx having a resistor R16 with a base resistance value in series, a reference resistor Rref having the resistance value resolution of 125 Ω can be realized. In this case, by combining the high level and the low level in the switching signals 11 to 15, the reference resistor Rref in which the resistance value can be adjusted in the range of +0 Ω to +3.875 kΩ with respect to the base resistance value is realized.

An on-resistance is generated in the NMOS transistors N51 to N55 in the on state. This on-resistance causes an error in the resistance value of the reference resistor Rref. In order to suppress the error of the reference resistor Rref caused by the error in the NMOS transistors N51 to N55 to 10%, for example, the on-resistances of the NMOS transistors N51 to N55 need to be set to 12.5Ω, 25Ω, 50Ω, 100Ω, and 200Ω, which is 10% of the resistance values of the resistors R11 to R15.

For example, in order to realize the on-resistance smaller than 100Ω, it is necessary to increase the sizes of the NMOS transistors N51 to N53, and in particular, in order to realize the on-resistance of 12.5Ω, the size of the NMOS transistor N51 increases. That is, there is a problem that the occupied area by the NMOS transistor configuring the short-circuit switch increases.

<Configuration of Reference Resistor>

Figure 10:
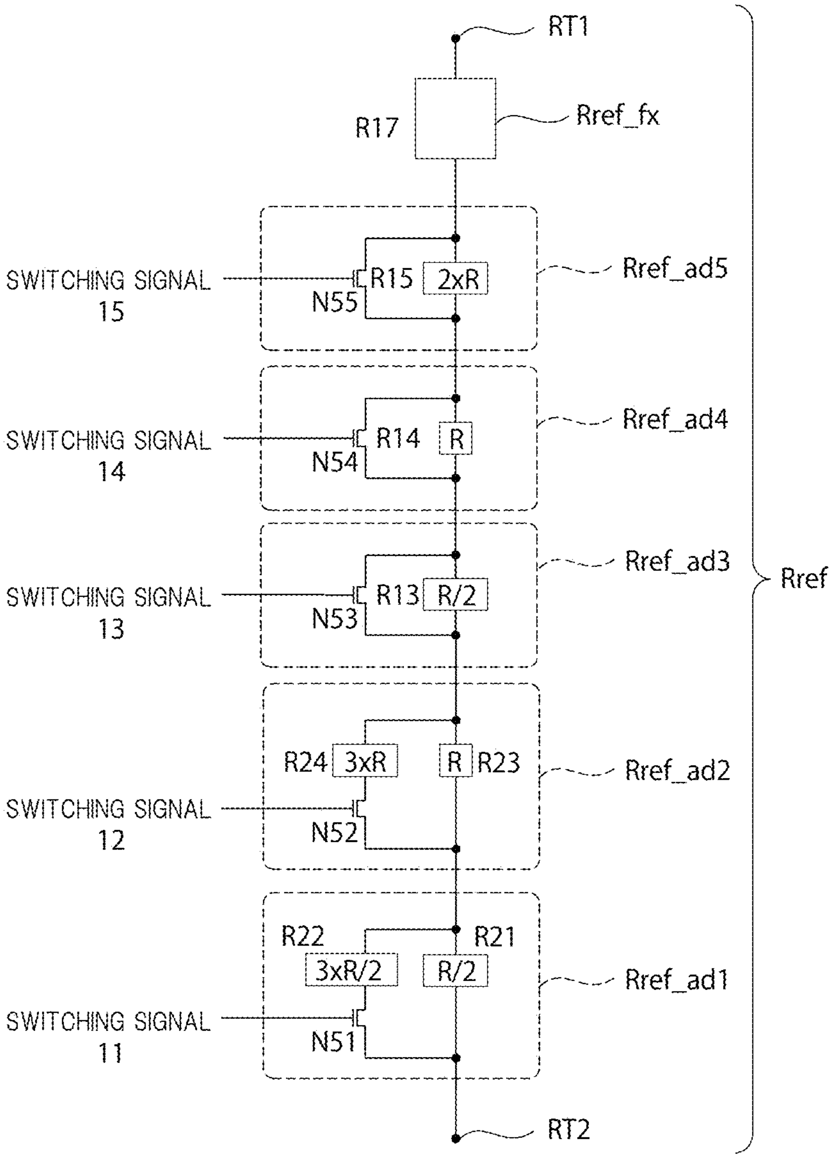
FIG. 10 is a circuit diagram illustrating a configuration of a reference resistor according to a second embodiment.

FIG. 10 is a circuit diagram illustrating a configuration of a reference resistor according to a second embodiment. In FIG. 10, a reference sign Rref indicates a reference resistor. Similarly to the configuration of the comparative example illustrated in FIG. 17, the reference resistor Rref is configured by a resistance value fixing unit Rref_fx and five resistance value adjustment units Rref_ad1 to Rref_ad5 connected in series between the terminal nodes RT1 and RT2. The resistance value fixing unit Rref_fx includes a resistor R17 with a base resistance value, and the resistance values of the resistance value adjustment units Rref_ad1 to Rref_ad5 controlled by the switching signals 11 to 15 are added to the base resistance value to become a resistance value of the reference resistor Rref. At this time, the resistance value resolution added to the base resistance value becomes coarse in the order of the resistance value adjustment units Rref_ad1 to Rref_ad5.

Here, a case where the resistors configuring the resistance value adjustment units Rref_ad1 to Rref_ad5 are configured by combining the basic resistor R having the resistance value of 1 kΩ described in FIG. 17 will be described, but it is not limited thereto. In addition, a case where the reference resistor Rref includes five resistance value adjustment units will be described, but the number is not limited to five.

The resistance value adjustment unit Rref_ad1 includes resistors R21 and R22 and the NMOS transistor N51 configuring the short-circuit switch. The resistor R22 and the NMOS transistor N51 are connected in series, and the resistor R21 is connected in parallel to the resistor R22 and the NMOS transistor N51 connected in series. Here, the resistor R22 has two sets of resistor sets (3×R) in which three basic resistors R are connected in series. The resistor R22 is realized by parallel connection (3×R/2) of two sets of resistor sets (3×R). The resistor R21 is realized by parallel connection (R/2) of two basic resistors R.

As described in the comparative example, since the basic resistor R is 1 kΩ, a resistance value of the resistor R22 is 1.5 kΩ, and a resistance value of the resistor R21 is 0.5 kΩ. Therefore, a resistance value of the resistance value adjustment unit Rref_ad1 when the NMOS transistor N51 is turned on by the switching signal 11 is 0.375 kΩ, and a resistance value of the resistance value adjustment unit Rref_ad1 when the NMOS transistor N51 is turned off is 0.5 kΩ. Therefore, a difference in the resistance value of the resistance value adjustment unit Rref_ad1 generated by turning on/off the short-circuit switch is set to 125 Ω as in the comparative example. In addition, the number of elements configuring the resistance value adjustment unit Rref_ad1 (the number of NMOS transistors and the number of basic resistors) is the same as that of the resistance value adjustment unit of the comparative example (the number of NMOS transistors is one, and the number of basic resistors is eight).

The resistance value adjustment unit Rref_ad2 includes resistors R23 and R24 and the NMOS transistor N52 configuring the short-circuit switch. In the resistance value adjustment unit Rref_ad2, the resistor R24 and the NMOS transistor N52 are connected in series, and the resistor R23 is connected in parallel to the resistor R24 and the NMOS transistor N52 connected in series. Here, the resistor R24 is configured by three basic resistors R connected in series, and the resistor R23 is configured by one basic resistor R.

As a result, when the NMOS transistor N52 is turned on by the switching signal 12, the resistor R23 having a resistance value of 1 kΩ and the resistor R24 having a resistance value of 3 kΩ are connected in parallel, a resistance value of the resistance value adjustment unit Rref_ad2 is 0.75 kΩ, and the resistance value of the resistance value adjustment unit Rref_ad2 when the NMOS transistor N52 is turned off is 1 kΩ. Therefore, a difference in the resistance value of the resistance value adjustment unit Rref_ad2 generated by turning on/off the short-circuit switch is set to 250 Ω as in the comparative example. In addition, the number of elements configuring the resistance value adjustment unit Rref_ad2 (the number of NMOS transistors and the number of basic resistors) is the same as that of the resistance value adjustment unit of the comparative example (the number of NMOS transistors is one, and the number of basic resistors is four).

Since the resistance value adjustment units Rref_ad3 to Rref_ad5 are similar to the resistance value adjustment units Rref_ad3 to Rref_ad5 illustrated in FIG. 17, the description thereof will be omitted.

A value of the resistor R17 configuring the resistance value fixing unit Rref_fx is set to a value lower by about 1 kΩ than the resistance value of the resistor R16 described in the comparative example. This is because, in the comparative example, when the NMOS transistors N51 and N52 are turned on by the switching signals 11 and 12, the resistance values of the resistance value adjustment units Rref_ad1 and Rref_ad2 become 0Ω, whereas in the case of the second embodiment, the resistance values of the resistance value adjustment units Rref_ad1 and Rref_ad2 become 0.375 kΩ and 0.75 kΩ.

The reference resistor Rref according to the second embodiment can adjust the resistance value in almost the same resolution (125Ω) and range as the comparative example by controlling the short-circuit switch (NMOS transistors N51 to N55) by the switching signals 11 to 15. Similarly to the comparative example, in a case where the error generated by the on-resistance of the NMOS transistor configuring the short-circuit switch is suppressed to 10%, the resistance values of the resistors R22 and R24 connected in series to the NMOS transistors N51 and N52 are large, at 1.5 kΩ and 3 kΩ, and thus, the values of the on-resistance allowed for the NMOS transistors N51 and N52 can be increased to 150 Ω (=1.5 kΩ×10%) and 300 (=3 kΩ×10%). As a result, sizes of the NMOS transistors N51 and N52 can be reduced. Further, since the resistance value of the resistor R17 is reduced, the resistor R17 can also be reduced in size. That is, the increase in the occupied area can be suppressed.

In order to suppress the error to 10%, the values of the on-resistance allowed for the NMOS transistors N53 to N55 are the same as those in the comparative example, and are 50Ω, 100Ω, and 200Ω.

<Modification>

FIG. 10 illustrates the reference resistor Rref including the resistance value adjustment unit in which the basic resistor R configuring the resistor (R11) is divided into 1:3 (1 to 3), the basic resistor R having the ratio of 3 is changed from the parallel connection to the series connection, the short-circuit switch is connected in series to the basic resistor of the series connection, and the basic resistor R having the ratio of 1 is connected in parallel with respect to the resistance value adjustment unit (for example, Rref_ad1) including the resistors in which four or more basic resistors R are connected in parallel in the comparative example illustrated in FIG. 17. In FIG. 17, the resistance value adjustment units having a configuration in which four or more basic resistors R are connected in parallel are Rref_ad1 and Rref_ad2. Describing the resistance value adjustment unit Rref_ad2 illustrated in FIG. 17, in FIG. 17, the resistor R12 configured by four basic resistors R connected in parallel is divided into a resistor R24 configured by three basic resistors R connected in series and a resistor R23 configured by one basic resistor R in FIG. 10, the resistor R24 is connected in series with the NMOS transistor N52 configuring the short-circuit switch, and the resistor R23 is connected in parallel with the NMOS transistor N52 and the resistor R24 connected in series.

On the other hand, in the modification, in the comparative example illustrated in FIG. 17, the reference resistor is configured by dividing the resistor configured by connecting N basic resistors R of two or more in parallel into 1:N−1 (1 to N−1) and changing the basic resistor R having the ratio of N−1 from the parallel connection to the series connection.

Figure 11:
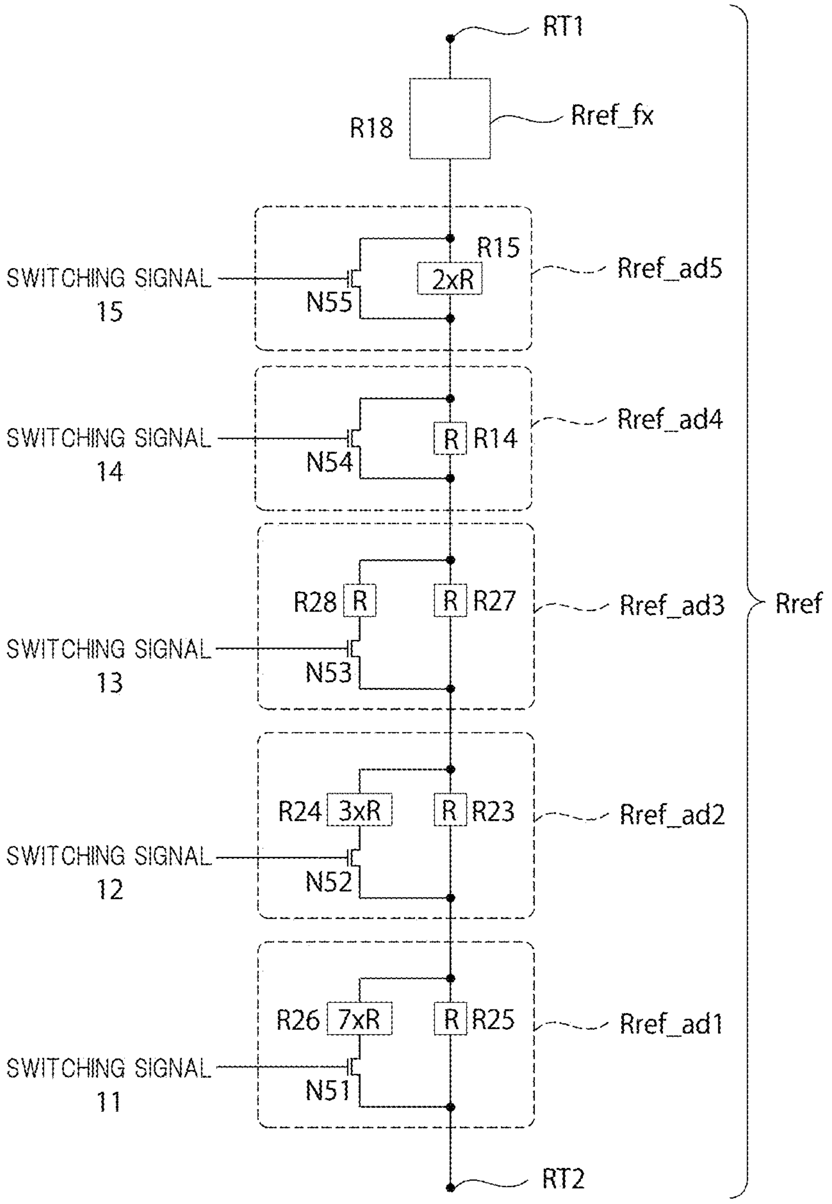
FIG. 11 is a circuit diagram illustrating a configuration of a reference resistor according to a modification of the second embodiment.

FIG. 11 is a circuit diagram illustrating a configuration of the reference resistor according to the modification of the second embodiment. Similarly to FIGS. 10 and 17, the reference resistor Rref is configured by the resistance value fixing unit Rref_fx and the five resistance value adjustment units Rref_ad1 to Rref_ad5 connected in series between the terminal nodes RT1 and RT2. The resistance value fixing unit Rref_fx includes a resistor R18 with a base resistance value, and the resistance values of the resistance value adjustment units Rref_ad1 to Rref_ad5 controlled by the switching signals 11 to 15 are added to the base resistance value to become a resistance value of the reference resistor Rref.

In the comparative example of FIG. 17, the resistance value adjustment unit Rref_ad1 includes the resistor R11 including eight (N) basic resistors R connected in parallel. In the modification illustrated in FIG. 11, the resistor R11 is divided into a resistor R25 including one basic resistor R and a resistor R26 including seven (N−1) basic resistors R connected in series. In the resistance value adjustment unit Rref_ad1, the NMOS transistor N51 is connected in series to the resistor R26, and the resistor R25 is connected in parallel to a series circuit configured by the resistor R26 and the NMOS transistor N51. Since the resistance value adjustment unit Rref_ad1 according to the modification is configured by eight basic resistors R and one NMOS transistor, the resistance value adjustment unit Rref_ad1 has the same number of elements as the resistance value adjustment unit Rref_ad1 illustrated in FIG. 17.

When the NMOS transistor N51 is turned on by the switching signal 11, seven basic resistors R connected in series and one basic resistor R are connected in parallel, so that the resistance value of the resistance value adjustment unit Rref_ad1 is 0.875 kΩ. On the other hand, when the NMOS transistor N51 is turned off, the resistance value of the resistance value adjustment unit Rref_ad1 is 1 kΩ. By turning the NMOS transistor N51 on/off, the difference in the resistance value of the resistance value adjustment unit Rref_ad1 is 125 Ω similarly to FIG. 10 and the comparative example.

In FIG. 11, the resistance value adjustment units Rref_ad2, Rref_ad4, and Rref_ad5 are similar to those in FIG. 10. In the case of the resistance value adjustment unit Rref_ad2, the number of basic resistors R connected in parallel in FIG. 17 is four, and division into 1:3 in FIG. 10 and division into 1:N−1 in FIG. 11 lead to the same result. In the case of the resistance value adjustment units Rref_ad4 and Rref_ad5, the basic resistors R are not connected in parallel in FIG. 17. Next, the resistance value adjustment unit Rref_ad3 in which the basic resistors R are connected in parallel in FIG. 17 and can be divided into 1:N−1 will be described.

In the comparative example of FIG. 17, the resistance value adjustment unit Rref_ad3 includes the resistor R13 including two (N) basic resistors R connected in parallel. In the modification illustrated in FIG. 11, the resistor R13 is divided into a resistor R27 including one basic resistor R and a resistor R28 including one (N−1) basic resistor R. In the resistance value adjustment unit Rref_ad3, the NMOS transistor N53 is connected in series to the resistor R28, and the resistor R27 is connected in parallel to the series circuit configured by the resistor R28 and the NMOS transistor N53. Since the resistance value adjustment unit Rref_ad3 according to the modification is configured by two basic resistors R and one NMOS transistor, the resistance value adjustment unit Rref_ad3 has the same number of elements as the resistance value adjustment unit Rref_ad3 illustrated in FIG. 17.

When the NMOS transistor N53 is turned on by the switching signal 13, the two basic resistors R are connected in parallel, so that the resistance value of the resistance value adjustment unit Rref_ad3 is 0.500 kΩ. On the other hand, when the NMOS transistor N53 is turned off, the resistance value of the resistance value adjustment unit Rref_ad1 is 1 kΩ. By turning the NMOS transistor N53 on/off, the difference in the resistance value of the resistance value adjustment unit Rref_ad2 is 500 Ω similarly to FIG. 10 and the comparative example.

When the NMOS transistors N51 to N53 are turned on, the resistance values added to the resistance value fixing unit Rref_fx by the resistance value adjustment unit increase to 0.875 kΩ, 0.750 kΩ, and 0.500 kΩ, so that the resistance value of the resistor R18 configuring the resistance value fixing unit Rref_fx is set to be smaller by about 2 kΩ than the resistor R16 illustrated in the comparative example.

The reference resistor Rref according to the modification can adjust the resistance value in almost the same resolution (125Ω) and range as the comparative example by controlling the short-circuit switch (NMOS transistors N51 to N55) by the switching signals 11 to 15. Similarly to the comparative example, in a case where the error generated by the on-resistance of the NMOS transistor configuring the short-circuit switch is suppressed to 10%, the resistance values of the resistors R26, R24, and R28 connected in series to the NMOS transistors N51, N52, and N53 are large, at 7 kΩ, 3 kΩ, and 1 kΩ, and thus, the values of the on-resistance allowed for the NMOS transistors N51, N52, and N53 can be increased to 700 Ω (=7 kΩ×10%), 300 Ω (=3 kΩ×10%), and 100 Ω (=1 kΩ×10%). As a result, the sizes of the NMOS transistors N51, N52, and N53 can be reduced (about 1/50 times, about 1/10 times, and about 1/2 times as compared to the comparative example). Further, since the resistance value of the resistor R18 is reduced, the resistor R18 can also be reduced in size. That is, the increase in the occupied area can be suppressed.

In order to suppress the error to 10%, the values of the on-resistance allowed for the NMOS transistors N54 and N55 are the same as those in the comparative example, and are 100Ω and 200Ω.

<Configuration of Semiconductor Device>

Figure 12A:
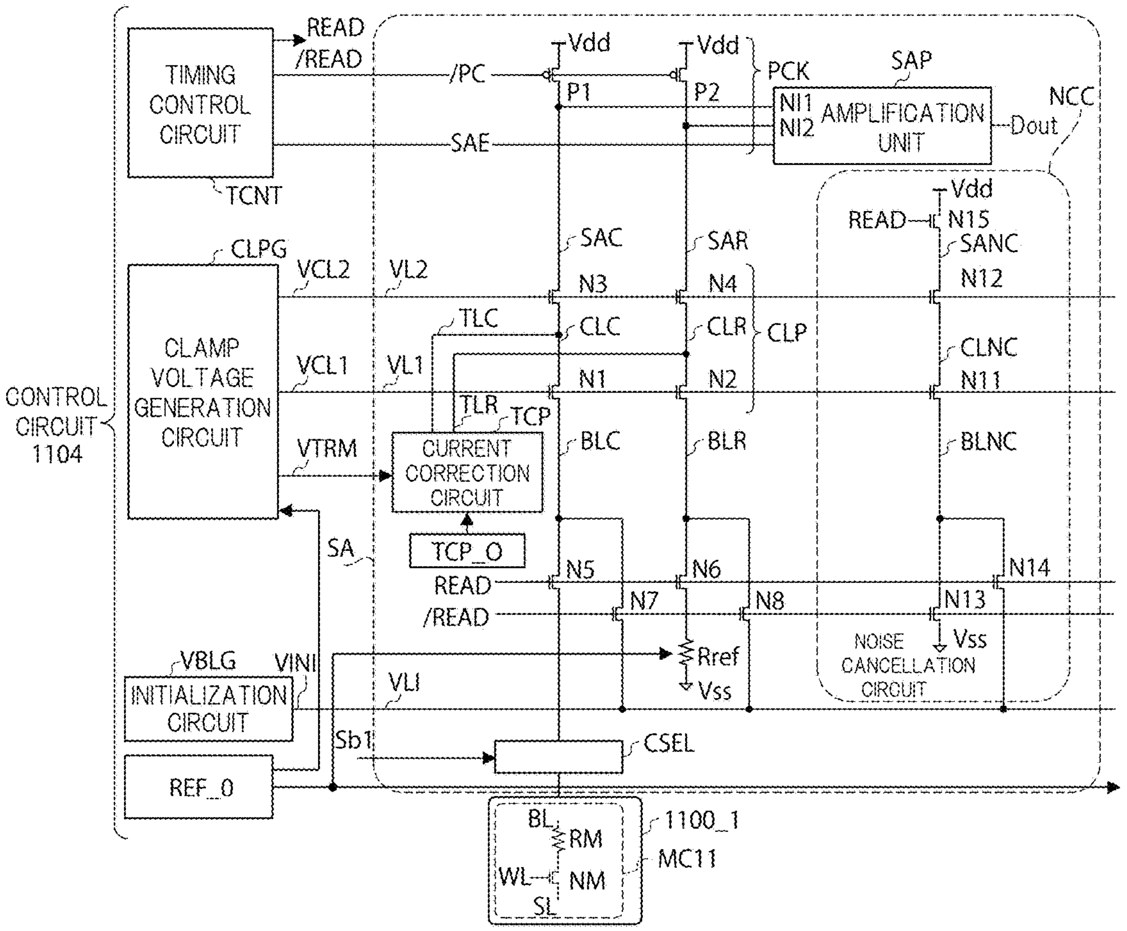
FIGS. 12A and 12B are diagrams for describing a semiconductor device according to the second embodiment.
Figure 12B:
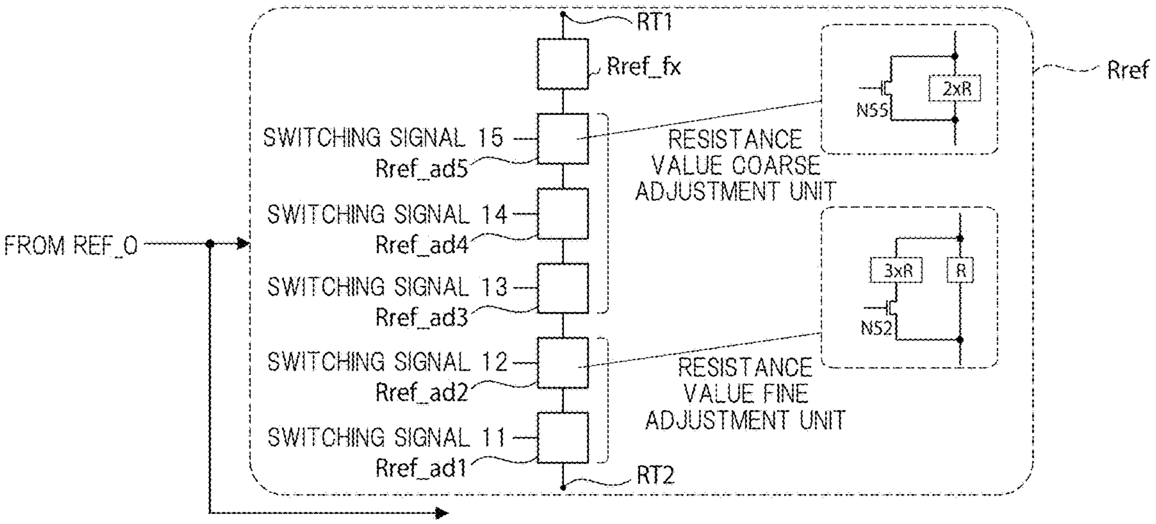

FIGS. 12A and 12B are diagrams a for describing semiconductor device according to the second embodiment. Here, FIG. 12A is a circuit diagram illustrating a configuration of the semiconductor device according to the second embodiment, and FIG. 12B is a circuit diagram illustrating a configuration of the reference resistor.

FIG. 12A is similar to FIG. 1A. The main difference is that, in FIG. 12A, a resistance value information storage circuit REF_O for setting a resistance value of the reference resistor Rref is indicated. The switching signals 11 to 15 for setting the resistance value of the reference resistor to an appropriate value are stored in the resistance value information storage circuit REF_O in advance. In the second embodiment, the reference resistor Rref is provided in each of the clamp voltage generation circuit and the plurality of sense amplifiers SA, and an output of the resistance value information storage circuit REF_O is supplied to the reference resistor Rref in the clamp voltage generation circuit and the plurality of sense amplifiers SA. As a result, it is possible to set the resistance value of each reference resistor Rref to an appropriate value while suppressing the increase in the occupied area by the resistance value information storage circuit REF_O.

The terminal node RT1 of the reference resistor Rref is connected to the source terminal of the NMOS transistor N6 illustrated in FIG. 12A, and the terminal node RT2 is connected to the ground voltage Vss. The switching signals 11 to 15 are supplied from the resistance value information storage circuit REF_O to the resistance value adjustment units Rref_ad1 to Rref_ad5. As described with reference to FIGS. 10 and 11, the resistance value of the reference resistor Rref is adjusted to an appropriate value by the switching signals 11 to 15.

When it is regarded that the adjustment function unit that adjusts the resistance value is configured by the resistance value adjustment units Rref_ad1 to Rref_ad5, the adjustment function unit can be regarded as being configured by a resistance value coarse adjustment unit (first adjustment unit) that coarsely adjusts the resistance value and a resistance value fine adjustment unit (second adjustment unit) that finely adjusts the resistance value in order to adjust a certain range of the resistance value with high resolution.

FIG. 12B corresponds to the reference resistor Rref illustrated in FIG. 10, and in FIG. 12B, the resistance value adjustment units Rref_ad1 to Rref_ad2 correspond to the resistance value fine adjustment unit, and the resistance value adjustment units Rref_ad3 to Rref_ad5 correspond to the resistance value coarse adjustment unit. As illustrated in FIG. 12B, the resistance value coarse adjustment unit (first adjustment unit) is configured by a resistance element (first resistance element: 2xR) configured by a basic resistor R, and a MOS transistor (N55) functioning as a short-circuit switch connected in parallel with the first resistance element, and the resistance value fine adjustment unit (second adjustment unit) is configured by an adjustment unit configured by a resistance element (second resistance element: 3xR), and a short-circuit switch (N52) connected in series with the second resistance element, and a resistance element (third resistance element: R) connected in parallel with the adjustment unit.

In the first and second embodiments, an MRAM has been described as an example of the nonvolatile storage device, but it is not limited thereto, and for example, a variable-resistance memory such as a resistive random access memory (ReRAM) may be used.

Although the invention made by the present inventors has been specifically described based on the embodiments, the present invention is not limited to the above embodiments, and it goes without saying that various modifications can be made without departing from the gist of the present invention.

What is claimed is:

1. A semiconductor device comprising:

a variable-resistance memory cell array;

a sense amplifier electrically connected to the variable-resistance memory cell array; and a clamp voltage generation circuit electrically connected to the sense amplifier, wherein the sense amplifier includes:

an amplification unit configured to amplify a voltage at a sense node;

a first clamp circuit having a first NMOS transistor and a second NMOS transistor, gate terminals of which are electrically connected to each other;

a second clamp circuit having a third NMOS transistor and a fourth NMOS transistor, gate terminals of which are electrically connected to each other;

a fifth NMOS transistor electrically connected to the variable-resistance memory cell array;

a reference resistor; and a sixth NMOS transistor electrically connected to the reference resistor, wherein a drain terminal of the third NMOS transistor is electrically connected to the amplification unit via a first node configuring the sense node, wherein a drain terminal of the fourth NMOS transistor is electrically connected to the amplification unit via a second node configuring the sense node, wherein a source terminal of the third NMOS transistor is electrically connected to a drain terminal of the first NMOS transistor via a third node, wherein a source terminal of the fourth NMOS transistor is electrically connected to a drain terminal of the second NMOS transistor via a fourth node, wherein a source terminal of the first NMOS transistor is electrically connected to a drain terminal of the fifth NMOS transistor via a fifth node, wherein a source terminal of the second NMOS transistor is electrically connected to a drain terminal of the sixth NMOS transistor via a sixth node, wherein a source terminal of the fifth NMOS transistor is electrically connected to the variable-resistance memory cell array, wherein a source terminal of the sixth NMOS transistor is electrically connected to the reference resistor, wherein the clamp voltage generation circuit supplies a first clamp voltage to the gate terminals of the first NMOS transistor and the second NMOS transistor, and supplies a second clamp voltage to the gate terminals of the third NMOS transistor and the fourth NMOS transistor, and wherein transconductance of the third NMOS transistor and the fourth NMOS transistor is lower than transconductance of the first NMOS transistor and the second NMOS transistor.

2. The semiconductor device according to claim 1, wherein a channel length of the first NMOS transistor and the second NMOS transistor is shorter than a channel length of the third NMOS transistor and the fourth NMOS transistor, and/or a channel width of the first NMOS transistor and the second NMOS transistor is longer than a channel width of the third NMOS transistor and the fourth NMOS transistor.

3. The semiconductor device according to claim 2, wherein the sense amplifier includes a current correction circuit electrically connected to the third node and the fourth node, and wherein the current correction circuit applies a correction current based on a correction current bias signal input from the clamp voltage generation circuit to the third node and/or the fourth node.

4. The semiconductor device according to claim 1, further comprising:

a VBL initialization circuit configured to generate an initialization potential to be supplied to the fifth node and the sixth node, wherein the sense amplifier further includes:

a seventh NMOS transistor having a drain terminal electrically connected to the fifth node and a source terminal electrically connected to the VBL initialization circuit; and an eighth NMOS transistor having a drain terminal electrically connected to the sixth node and a source terminal electrically connected to the VBL initialization circuit, and wherein the seventh NMOS transistor and the eighth NMOS transistor are turned on and the fifth NMOS transistor and the sixth NMOS transistor are turned off during standby.

5. The semiconductor device according to claim 4, wherein the sense amplifier further includes:

a first PMOS transistor;

a second PMOS transistor; and a noise cancellation circuit, wherein the noise cancellation circuit includes:

an 11th NMOS transistor;

a 12th NMOS transistor;

a 13th NMOS transistor;

a 14th NMOS transistor; and a 15th NMOS transistor, wherein a gate terminal of the 11th NMOS transistor is electrically connected to the clamp voltage generation circuit, so that the first clamp voltage is supplied, wherein a gate terminal of the 12th NMOS transistor is electrically connected to the clamp voltage generation circuit, so that the second clamp voltage is supplied, wherein a drain terminal of the 11th NMOS transistor is electrically connected to a source terminal of the 12th NMOS transistor, wherein a source terminal of the 11th NMOS transistor is electrically connected to a drain terminal of the 13th NMOS transistor and a drain terminal of the 14th NMOS transistor, wherein a source terminal of the 14th NMOS transistor is electrically connected to the VBL initialization circuit, wherein the first PMOS transistor is electrically connected to the first node, wherein the second PMOS transistor is electrically connected to the second node, wherein the 15th NMOS transistor is electrically connected to a drain terminal of the 12th NMOS transistor, and wherein the 13th NMOS transistor and the 15th NMOS transistor are turned on and the 14th NMOS transistor is turned off during the standby.

6. The semiconductor device according to claim 1, wherein the reference resistor includes:

a first adjustment unit; and a second adjustment unit connected in series with the first adjustment unit, wherein, in the first adjustment unit, a first resistance element and a first transistor functioning as a short-circuit switch are connected in parallel, and wherein, in the second adjustment unit, an adjustment unit in which a second resistance element and a second transistor functioning as a short-circuit switch are connected in series is connected in parallel with a third resistance element.

7. The semiconductor device according to claim 1, wherein the variable-resistance memory cell array is a magnetoresistive memory cell array.

8. A semiconductor device comprising:

a memory cell array in which a plurality of variable-resistance memory cells are arranged;

a sense amplifier connected to the memory cell array; and a clamp voltage generation circuit configured to generate a clamp voltage clamping a voltage applied to a variable-resistance memory cell selected from the plurality of variable-resistance memory cells during a read operation, wherein the sense amplifier includes:

an amplification unit configured to amplify a potential difference between a pair of sense nodes;

a precharge circuit configured to supply a predetermined voltage to the pair of sense nodes during standby before the read operation;

a reference resistor;

a first MOS transistor and a second MOS transistor, source-drain paths of which are connected in series between one sense node of the pair of sense nodes and the selected variable-resistance memory cell; and a third MOS transistor and a fourth MOS transistor, source-drain paths of which are connected in series between the other sense node of the pair of sense nodes and the reference resistor, wherein the clamp voltage is applied to gate terminals of the first MOS transistor, the second MOS transistor, the third MOS transistor, and the fourth MOS transistor, wherein a size of the first MOS transistor connected to the one sense node of the first MOS transistor and the second MOS transistor is smaller than a size of the second MOS transistor, and wherein a size of the third MOS transistor connected to the other sense node of the third MOS transistor and the fourth MOS transistor is smaller than a size of the fourth MOS transistor.

9. The semiconductor device according to claim 8, wherein the sense amplifier includes a current correction circuit that supplies a correction current to a node connecting the first MOS transistor and the second MOS transistor and a node connecting the third MOS transistor and the fourth MOS transistor.

10. The semiconductor device according to claim 9, wherein the clamp voltage generation circuit generates, as the clamp voltage, a first clamp voltage and a second clamp voltage different from the first clamp voltage, wherein a gate terminal of the first MOS transistor and a gate terminal of the third MOS transistor are connected to a first wiring to which the first clamp voltage is applied, wherein a gate terminal of the second MOS transistor and a gate terminal of the fourth MOS transistor are connected to a second wiring to which the second clamp voltage is applied, wherein the semiconductor device further comprises an initialization circuit configured to generate an initialization voltage having a value lower than the predetermined voltage supplied by the precharge circuit, and wherein the sense amplifier includes a selection circuit that supplies the initialization voltage generated by the initialization circuit to the third MOS transistor and the fourth MOS transistor during the standby.

11. The semiconductor device according to claim 10, wherein the sense amplifier includes a noise cancellation circuit having a fifth MOS transistor and a sixth MOS transistor, source-drain paths of which are connected in series, wherein a gate terminal of the fifth MOS transistor is connected to the first wiring, and a gate terminal of the sixth MOS transistor is connected to the second wiring, and wherein the initialization voltage is supplied to the sixth MOS transistor by the selection circuit during the standby.

* * * * *